(12) United States Patent
Kim et al.

(10) Patent No.: US 11,302,769 B2
(45) Date of Patent: Apr. 12, 2022

(54) DISPLAY DEVICE

(71) Applicant: Samsung Display Co., LTD., Yongin-si (KR)

(72) Inventors: Dong Won Kim, Seoul (KR); Hwa Jeong Kim, Hwaseong-si (KR); Ki Ho Bang, Hwaseong-si (KR); Dong Hyun Son, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 78 days.

(21) Appl. No.: 16/998,160

(22) Filed: Aug. 20, 2020

(65) Prior Publication Data

US 2021/0257435 A1  Aug. 19, 2021

(30) Foreign Application Priority Data

Feb. 18, 2020  (KR) .......................... 10-2020-0019503

(51) Int. Cl.
*H01L 27/32* (2006.01)

(52) U.S. Cl.
CPC ........ *H01L 27/3276* (2013.01); *H01L 27/326* (2013.01); *H01L 27/3223* (2013.01)

(58) Field of Classification Search
CPC .......................... H01L 27/3276; H01L 27/326
See application file for complete search history.

(56) References Cited

U.S. PATENT DOCUMENTS

2013/0248869 A1*  9/2013  Chang .................... H01L 33/08
                                                        257/59
2019/0393247 A1* 12/2019  Huang ................ H01L 27/1255
2021/0013287 A1    1/2021  Bang et al.

FOREIGN PATENT DOCUMENTS

| KR | 101779703 B1    | 9/2017  |
| KR | 1020180030325 A | 3/2018  |
| KR | 1020180127084 A | 11/2018 |
| KR | 1020190038718 A | 4/2019  |

* cited by examiner

*Primary Examiner* — Douglas M Menz
(74) *Attorney, Agent, or Firm* — Cantor Colburn LLP

(57) ABSTRACT

A display device includes an active area including pixels arranged in a matrix shape, a non-active area disposed at one side of the active area in a first direction and including a pad unit, non-active fanout wirings disposed in the non-active area and connected to the pad unit, signal wirings extending in the first direction to traverse the active area and connected to the pixels, and connection wirings, each at least partially passing through the active area and connecting some of the non-active fanout wirings and some of the signal wirings. Each of the connection wirings include first and third extension portion extending in the first direction, and a second extension portion extending in a second direction, and at least two of the pixels are disposed between corresponding extension portions of two adjacent connection wirings along a direction in which the corresponding extension portions are spaced apart from each other.

20 Claims, 20 Drawing Sheets

130: 131,132
150: 151, 152, 153

DISPLAY DEVICE

This application claims priority to Korean Patent Application No. 10-2020-0019503, filed on Feb. 18, 2020 and all the benefits accruing therefrom under 35 U.S.C. § 119, the content of which in its entirety is herein incorporated by reference.

BACKGROUND

1. Field of the Invention

The present invention relates to a display device.

2. Description of the Related Art

The importance of a display device has increased with the development of multimedia. Accordingly, various types of display devices, such as a liquid crystal display ("LCD"), an organic light emitting diode display ("OLED"), and an inorganic light emitting diode display device, have been developed.

A display device includes an active area in which an image is displayed and a non-active area disposed around the active area. Wirings for applying signals to the active area are arranged in the non-active area.

Recently, a display device having a thin bezel has been preferred. When the area of the non-active area is too small for a thin bezel, paths through fanout wirings to pass signals therethrough become insufficient.

In order to secure paths of fanout wirings even in a thin bezel structure, a method of passing some of the fanout wirings through the active area may be considered. However, when passing the fanout wirings through the active area, the order of data signals is changed, and thus additional mapping of a driving chip may be required. Further, signal wirings may be made of different conductive layers for each area, and in this case, a difference in luminance for each area may occur due to process dispersion of each conductive layer.

SUMMARY

Aspects of the present invention are to provide a display device including connection wirings passing through an active area and capable of applying a general-purpose driving chip and reducing the occurrence of a luminance difference for each area by process dispersion of each conductive layer.

However, aspects of the present invention are not restricted to the one set forth herein. The above and other aspects of the present invention will become more apparent to one of ordinary skill in the art to which the present invention pertains by referencing the detailed description of the present invention given below.

According to an embodiment of the present disclosure, a display device includes an active area including a plurality of pixels arranged in a matrix shape and which receives a data signal by a data line, a non-active area disposed at one side of the active area in a first direction and including a pad unit, a plurality of non-active fanout wirings disposed in the non-active area and connected to the pad unit, a plurality of signal wirings extending in the first direction to traverse the active area and connected to the plurality of pixels, and a plurality of connection wirings, each at least partially passing through the active area and connecting some of the plurality of non-active fanout wirings and some of the plurality of signal wirings, where each of the plurality of connection wirings include a first extension portion extending in the first direction, a second extension portion extending in a second direction crossing the first direction, and a third extension portion extending in the first direction, and at least two of the pixels are disposed between corresponding extension portions of two connection wirings adjacent to each other among the plurality of connection wiring, and the at least two pixels are arranged along a direction in which the corresponding extension portions are spaced apart from each other.

The plurality of pixels may include a plurality of pixel columns each including pixels arranged in the first direction and a plurality of pixel rows each including pixels arranged in the second direction, and the second extension portion of the connection wiring may be disposed between the two adjacent pixel rows of the plurality of pixel rows.

At least two of the pixel rows may be disposed between the second extension portions of the two connection wirings adjacent to each other.

The display device may further comprise a first dummy wiring pattern disposed between the connection wirings, wherein the first dummy wiring pattern may include a first sub-pattern disposed between the second extension portions of the two connection wirings adjacent to each other, and the first sub-pattern may extend in the second direction.

The first sub-pattern may be disposed in a space between the two adjacent pixel rows of the plurality of pixel rows, and the second extension portion of the connection wirings may be not disposed in the space.

The first dummy wiring pattern may include a plurality of second sub-patterns separated from the second extension portions of the two connection wirings and disposed on a virtual extension line where the second extension portion reaches if the second extension portion extends further.

At least some of the first dummy wiring patterns may be directly connected to the connection wiring.

The active area may include an active fanout area in which the connection wirings are disposed adjacent to the non-active area, and a main active area which is an area other than the active fanout area in the active area and in which the connection wirings are not disposed, and the display device may further include a second dummy wiring pattern disposed in the main active area and extending in the second direction and a third dummy wiring pattern disposed in the main active area and extending in the first direction.

The second dummy wiring pattern may intersect the signal wiring and is disposed over the plurality of pixel columns.

The third dummy wiring pattern is disposed in a space between the pixel column at the pixel row of the main active area.

Each of the signal wirings may be disposed between the pixel columns, and each of the first extension portion and the third extension portion of the connection wiring may be disposed in a space between different pixel columns from each other.

At least two of the pixel columns may be disposed between the first extension portions of the two adjacent connection wirings.

At the first extension portion and the third extension portion of least one of the connection wirings may be disposed in a space between two adjacent pixel columns.

The plurality of signal wirings may be included in a first data conductive layer, and the plurality of connection wirings may be included in a second data conductive layer different from the first data conductive layer.

The non-active fanout wiring may include a first non-active fanout wiring connected to the connection wiring and a second non-active fanout wiring directly connected to the signal wiring, and the first non-active fanout wiring and the second non-active fanout wiring may be included in different conductive layers from each other.

According to another embodiment of the present disclosure, a display device includes an active area in which a plurality of pixels are arranged, a non-active area disposed at one side of the active area in a first direction, a plurality of non-active fanout wirings disposed in the non-active area and including a first non-active fanout wiring and a second non-active fanout wiring alternately arranged along a second direction crossing the first direction, a plurality of signal wirings extended in the first direction, disposed in an inner active area overlapping with the non-active fanout wiring when the non-active fanout wiring extends in the first direction in the active area and disposed in an outer active area not overlapping the non-active fanout wiring in the active area, a plurality of connection wirings connecting the non-active fanout wiring and the signal wiring disposed in the outer active area via the active area and a plurality of dummy wiring patterns disposed in the active area and not intersecting the connection wiring, wherein the connection wiring is disposed along a space between the plurality of pixels, and a length of an extension portion of the connection wiring in the first direction is longer than a length of an extension portion of the connection wiring in the second direction.

The plurality of connection wirings and the plurality of dummy wiring patterns may be included in the same conductive layer.

The plurality of connection wirings may include a first extension portion extending in the first direction, a second extension portion extending in the second direction crossing the first direction, and a third extension portion extending in the first direction, and at least two of the pixels may be disposed between the second extension portions of two connection wirings adjacent to each other among the plurality of connection wirings.

The dummy wiring pattern may include a first dummy wiring pattern disposed between the connection wirings and extending in the second direction, a second dummy wiring pattern extending in the second direction in an area where the connection wirings are not disposed in the active area, and a third dummy wiring pattern extending in the first direction and not intersecting the first dummy wiring pattern and the second dummy wiring pattern.

The first dummy wiring pattern may include a first sub-pattern disposed between the second extension portions of the two connection wirings adjacent to each other, the first sub-pattern extending in the second direction, and a plurality of second sub-patterns separated from the second extension portions of the two connection wirings and disposed on a virtual extension line where the second extension portion reaches if the second extension portion extend further, and at least some of the third dummy wiring patterns may be disposed between the second extension portion of the connection wiring and the first sub-pattern.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, embodiments of the present invention will be described with reference to the attached drawings.

Figure 1:
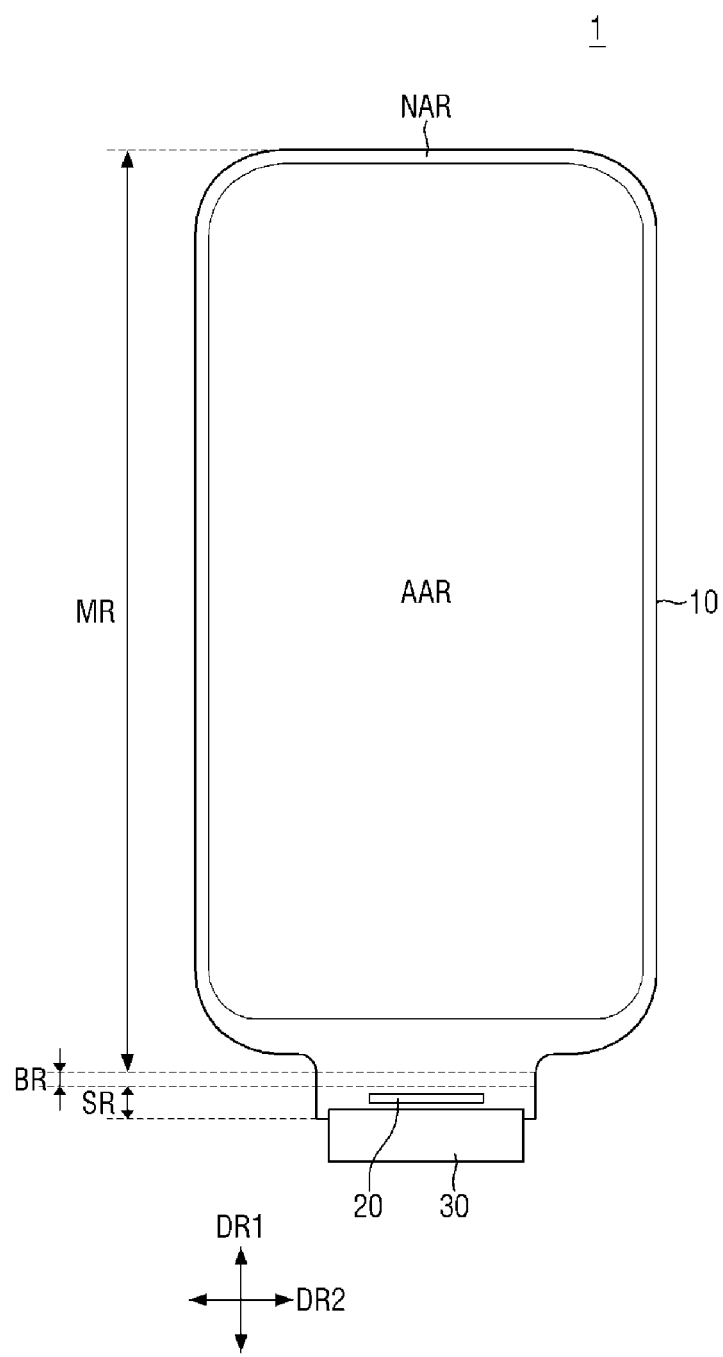
FIG. 1 is a plan view of a display device according to an embodiment.
Figure 2:
FIG. 2 is a side view of the display device of FIG. 1.

FIG. 1 is a plan view of a display device according to an embodiment. FIG. 1 shows a planar shape of a state before a display device is bent. In the drawings, the first direction DR1 indicates a vertical direction in a plan view, and the second direction DR2 indicates a horizontal direction in a plan view. FIG. 2 is a side view of the display device of FIG. 1. FIG. 2 shows a side shape of a display device in a state in which the display device is bent in a thickness direction. Here, the thickness direction is a direction perpendicular to a plane defined by the first and second directions DR1 and DR2.

Referring to FIGS. 1 and 2, a display device 1, which is a device for displaying a mobile image or a still image, may be used as a display screen of various products such as televisions, notebooks, monitors, billboards, and internets of things as well as portable electronic appliances such as mobile phones, smart phones, tablet personal computers ("PCs"), smart watches, watch phones, mobile communication terminals, electronic notebooks, electronic books, portable multimedia players ("PMPs"), navigators, and ultra mobile PCS ("UMPs").

The display device 1 may include a display panel 10. The display panel 10 may be a flexible substrate including a flexible polymer material such as polyimide. Accordingly, the display panel 10 may be warped, bent, folded, or rolled.

The display panel 10 may include an active area AAR displaying an image and a non-active area NAR not displaying an image. The display panel 10 may be divided into an active area AAR and a non-active area NAR in a plan view. The non-active area NAR may be disposed to surround the active area AAR.

The active area AAR may include a plurality of pixels PX (PX1, PX2, and PX3). The pixels PX (PX1, PX2, and PX3) may be arranged in a matrix shape. Each pixel may include a light emitting layer and a circuit layer that controls the amount of light emitted from the light emitting layer. The circuit layer may include wirings, electrodes, and at least one transistor. The light emitting layer may include an organic light emitting material. The light emitting layer may be sealed by an encapsulation film. The specific configuration of each pixel PX will be described later.

The display panel 10 may include a main area MR and a bending area BR connected to one side of the main area MR in the first direction DR1. The display panel 10 may further include a sub-area SR connected to the bending area BR at one side thereof (i.e., a side of the bending area BR opposite to the main area MR) in the first direction DR1 and bent in the thickness direction with respect to a bent axis extending along the second direction DR2 to overlap the main area MR in the thickness direction.

The main area MR may include the active area AAR. The non-active area NAR may be located at a peripheral edge of the active area AAR of the main area MR.

The main area MR may have a shape similar to the planar appearance of the display device 1. The main area MR may be a flat area located in one plane. However, the present invention is not limited thereto, and at least one of the remaining edges of the main area MR other than the edge (or side) connected to the bending area BR may be curved in the main area MR to form a curved surface or bend in the vertical direction in another embodiment.

When at least one of the remaining edges other than the edge (or side) connected to the bending area BR may be curved or bent in the main area MR, the active area AAR may also be disposed at the corresponding edge. However, the present invention is not limited thereto. The non-active area NAR that does not display the image may be disposed at the curved or bent edge, or both the active area AAR and the non-active area NAR may be disposed at the curved or bent edge in another embodiment.

The non-active area NAR of the main area MR may be located in an area from an outer boundary of the active area AAR to an edge of the display panel 10. Signal wirings or driving circuits for applying signals to the active area AAR may be disposed in the non-active area NAR of the main area MR.

The bending area BR may be connected to the lower short side of the main area MR. The width of the bending area BR in the second direction D2 may be smaller than the width (short width) of the main area MR in the second direction D2. The connection portion of the main area MR and the bending area BR may have an L-shaped cutting shape to reduce the width of a bezel.

In the bending area BR, the display panel 10 may be bent with curvature in a direction opposite to a display surface. Here, the display surface is a surface of the active area AAR through which light emitted from the pixels passes. As the display panel 10 is bent in the bending area BR, the surface of the display panel 10 may be reversed. That is, one surface of the display panel 10 facing upward may be curved to face a side and then face downward through the bending area BR.

The sub-area SR extends from the bending area BR. The sub-area SR may extend in a direction parallel to the main area MR immediately after the bending is completed. The sub-area SR may overlap the main area MR in the thickness direction of the display panel 10 in the bent state. The sub-area SR may overlap the non-active area NAR at the edge of the main area MR, and may overlap the active area AAR of the main area MR in the bent state. The width of the sub-area SR may be equal to the width of the bending area BR in the second direction DR2, but the present invention is not limited thereto.

A pad unit ('PDR' in FIG. 6) may be disposed on the sub-area SR of the display panel 10. An external device may be mounted (or attached) to the pad unit. Examples of the external device may include a driving chip 20, a driving substrate 30 such as a flexible printed circuit board or a rigid flexible printed circuit board, and the like. In addition, a wiring connection film, a connector, etc. may also be mounted on the pad unit as an external device. One external device or a plurality of external devices may be mounted on the sub-area SR. For example, as shown in FIGS. 1 and 2, the driving chip 20 may be disposed in the sub-area SR of the display panel 10, and the driving substrate 30 may be attached to the end of the sub-area SR. In this case, the display panel 10 may include both a pad unit connected to the driving chip 20 and a pad unit connected to the driving substrate 30. In another embodiment, a driving chip may be mounted on s film, and the film may be attached to the sub-area SR of the display panel 10.

The driving chip 20 may be mounted on one surface of the display panel 10, which is the same surface as the display surface. Here, as described above, as the bending area BR is bent to be inverted, the driving chip 20 may be mounted on a surface of the display panel 10, the surface facing downward in the thickness direction, to allow the upper surface of the driving chip 20 to face downward.

The driving chip 20 may be attached onto the display panel 10 through an anisotropic conductive film, or may be attached onto the display panel 10 by ultrasonic bonding. The width of the driving chip 20 in the horizontal direction (e.g., the second direction DR2) may be smaller than the width of the display panel 10 in the horizontal direction. The driving chip 20 may be disposed at the center of the sub-area SR in the horizontal direction (e.g., second direction DR2), and the left edge and right edge of the driving chip 20 may be spaced apart from the left edge and right edge of the sub-area SR, respectively.

The driving chip 20 may include an integrated circuit driving the display panel 10. In an embodiment, the integrated circuit may be a data driving integrated circuit generating and providing a data signal, but the present invention is not limited thereto. The driving chip 20 is connected to a wiring pad ('WR_PD' in FIG. 6) provided in the pad unit of the display panel 10 to provide a data signal toward the wiring pad. The wirings ('WR' in FIG. 6) connected to the wiring pad extend toward the pixels to apply a data signal to each pixel.

Figure 3:
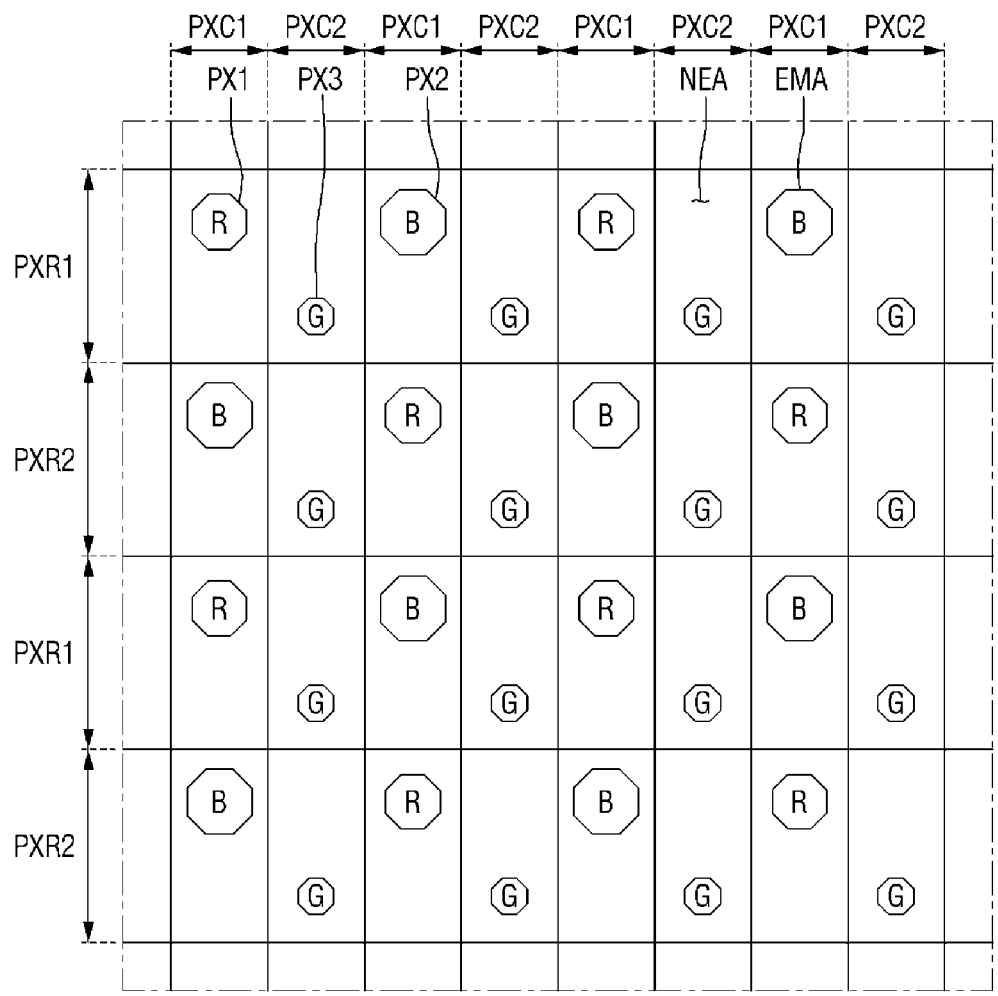
FIG. 3 is a layout view illustrating a pixel arrangement of a display device according to an embodiment.
Figure 3:
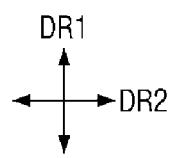

FIG. 3 is a layout view illustrating a pixel arrangement of a display device according to an embodiment.

Referring to FIG. 3, the pixel PX may include a first color pixel PX1, a second color pixel PX2, and a third color pixel PX3. In an embodiment, the first color pixel PX1 may be a red pixel, the second color pixel PX2 may be a blue pixel, and the third color pixel PX3 may be a green pixel. The respective pixels PX may be alternately arranged in a matrix form.

Each pixel PX may include a light emitting area EMA and a non-light emitting area NEA surrounding the light emitting area EMA. The sizes of the light emitting areas EMA in the color pixels PX1, PX2, and PX3 may be different from each other. For example, the light emitting area EMA of the second color pixel PX2 may be larger than the light emitting area EMA of the first color pixel PX1, and the light emitting area EMA of the third color pixel PX3 may be smaller than the size of the light emitting area EMA of the first color pixel PX1. The shape of the light emitting area EMA of each pixel may be generally octagonal, but is present invention not limited thereto, and the light emitting area EMA may have a hexagonal shape, a circular shape, a rhombus shape, or other polygonal shapes, or may have a polygonal shape with rounded edges in another embodiment.

In each of some pixel columns PXC (hereinafter, the first pixel column PXC1), the first color pixels PX1 and the second color pixels PX2 are alternately arranged along the first direction DR1 (i.e., column advancing direction). In each of other pixel columns PXC (hereinafter, the second pixel column PXC2), the third color pixels PX3 are repeatedly arranged along the first direction DR1. The first pixel columns PXC1 and the second pixel columns PXC2 are alternately arranged along the second direction DR2 (i.e., row advancing direction). For example, the odd-numbered pixel columns PXC may be the first pixel columns PXC1, and the even-numbered pixel columns PXC may be the second pixel columns PXC2.

The light emitting areas EMA belonging to one pixel column PXC may be substantially aligned along the first direction DR1. The light emitting areas EMA of one pixel column PXC may be arranged to be staggered with respect to the light emitting area EMA of the neighboring pixel column PXC in the second direction DR2. For example, the first color pixels PX1 and the second color pixels PX2 of the first pixel column PXC1 may be arranged to be aligned in a space between the adjacent third color pixels PX3 of the adjacent second pixel column PXC2 along the second direction DR2, and the third color pixels PX3 of the second pixel column PXC2 may be arranged to be aligned in a space between the first color pixels PX1 and the second color pixels PX2 adjacent to each other along the second direction DR2.

The pixel row PXR has a shape in which the first color pixels PX1 and the second color pixels PX2 are alternately arranged with the third color pixel PX3 therebetween. The first pixel row PXR1 may have a repeating arrangement unit of the first color pixel PX1, the third color pixel PX3, the second color pixel PX2, and the third color pixel PX3, and the second pixel row PXR2 may have a repeating arrangement unit of the second color pixel PX2, the third color pixel PX3, the first color pixel PX1, and the third color pixel PX3. The first pixel rows PXR1 and the second pixel rows PXR2 are alternately arranged along the first direction DR1 (e.g., column advancing direction). For example, the odd-numbered pixel rows PXR may be the first pixel rows PXR1, and the even-numbered pixel rows PXR may be the second pixel rows PXR2. In one pixel row PXR, the light emitting areas EMA of the first color pixel PX1 and the second color pixel PX2 may be biased to the other side of the first direction DR1 relative to the light emitting area EMA of the third color pixel PX3. That is, in the pixel raw PXR, the light emitting areas EMA of each pixel PX may be staggered along the second direction DR2.

Figure 4:
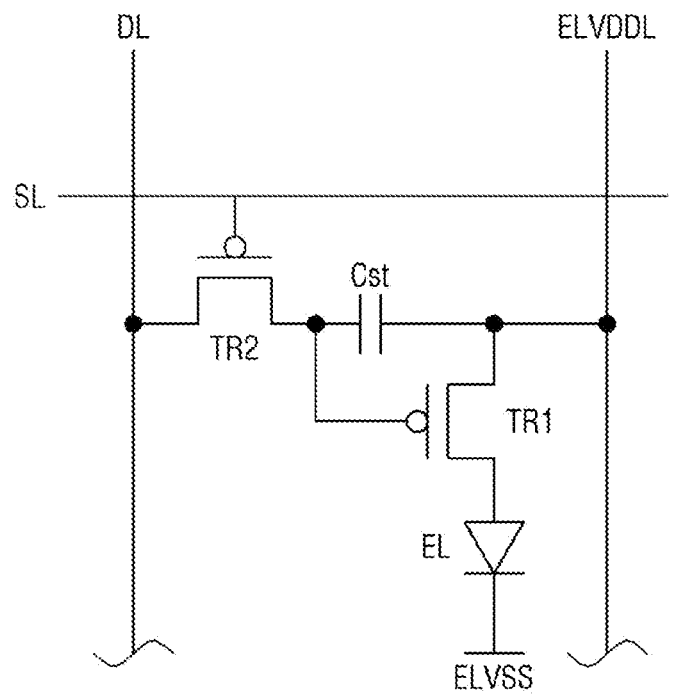
FIG. 4 is a circuit diagram of one pixel of a display device according to an embodiment.

The pixels PXs belonging to the same column may receive data signals from the same data line, and the pixels PXs belonging to the same row may receive gate signals from the same gate line. Each pixel PX may be driven by a pixel circuit. The pixel circuit may include a plurality of transistors and at least one capacitor. FIG. 4 illustrates a circuit diagram of an exemplary pixel circuit.

FIG. 4 is a circuit diagram of one pixel of a display device according to an embodiment.

Referring to FIG. 4, the pixel circuit may include a first transistor TR1, a second transistor TR2, a capacitor Cst, and an organic light emitting diode EL. A scanning line SL, a data line DL, and a first power voltage line ELVDDL are connected to each pixel PX circuit.

The first transistor TR1 may be a driving transistor, and the second transistor TR2 may be a switching transistor. Although it is shown in the drawing that both the first transistor TR1 and the second transistor TR2 are PMOS transistors, one or all of the first transistor TR1 and the second transistor TR2 may be NMOS transistors.

A first electrode (i.e., source electrode) of the first transistor TR1 is connected to the first power voltage line ELVDDL, and a second electrode (i.e., drain electrode) thereof is connected to a pixel electrode (or anode electrode)

of the organic light emitting diode EL. A first electrode (i.e., source electrode) of the second transistor TR2 is connected to the data line DL, and a second electrode (i.e., drain electrode) thereof is connected to a gate electrode of the first transistor TR1. The capacitor Cst is connected between the gate electrode and first electrode of the first transistor TR1. A common electrode (or cathode electrode) of the organic light emitting diode EL receives a second power voltage ELVSS. The second power voltage ELVSS may be a voltage lower than the first power voltage provided from the first power voltage line ELVDDL.

The second transistor TR2 may output a data signal applied to the data line DL in response to a scan signal applied to the scan line GL. The capacitor Cst may charge a voltage corresponding to the data signal received from the second transistor TR2. The first transistor TR1 may control a driving current flowing through the organic light emitting diode EL in response to the amount of charge stored in the capacitor Cst.

The equivalent circuit of FIG. 4 is just one embodiment, and the pixel circuit may include a larger number (for example, 7) of transistors and capacitors in another embodiment.

Figure 5:
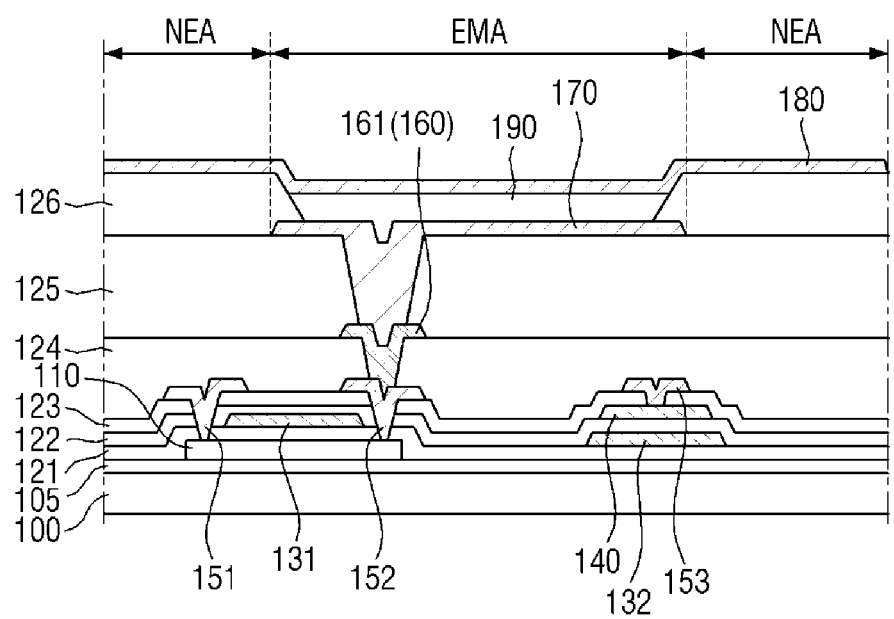
FIG. 5 is a cross-sectional view of one pixel of a display device.

FIG. 5 is a cross-sectional view of one pixel of a display device. In FIG. 5, the first transistor TR1 of the two transistors of FIG. 4 is shown in the form of a thin film transistor, and the second transistor TR2 is not shown.

The cross-sectional structure of the pixel PX will be described in detail with reference to FIG. 5. This display panel 10 may include a substrate 100, a buffer layer 105, a semiconductor layer 110, a first insulating layer 121, a first gate conductive layer 130, a second insulating layer 122, a second gate conductive layer 140, a third insulating layer 123, a first data conductive layer 150, a fourth insulating layer 124, a second data conductive layer 160, a fifth insulating layer 125, a pixel electrode 170, a pixel defining layer 126 defining an opening exposing the pixel electrode 170, an organic layer 190 disposed in the opening of the pixel defining layer 126, and a common electrode 180 disposed on the organic layer 190 and the pixel defining layer 126. Each of the above-described layers may be formed as a single film, but may also be formed as a laminated film including a plurality of films in another embodiment. Another layer may be further disposed between other layers.

The substrate 100 supports each layer disposed thereon. The substrate 100 may be made of an insulating material such as a polymer resin. Examples of the polymer resin may include polyethersulphone ("PES"), polyacrylate ("PA"), polyarylate ("PAR"), polyetherimide ("PEI"), polyethylene napthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), and combinations thereof. The substrate 100 may be a flexible substrate capable of bending, folding, rolling, or the like. Examples of the material constituting the flexible substrate may include, but are not limited to, polyimide (PI).

The buffer layer 105 is disposed on the substrate 100. The buffer layer 105 may prevent the diffusion of impurity ions, may prevent the penetration of moisture or external air, and may perform a surface planarization function. The buffer layer 105 may include silicon nitride, silicon oxide, or silicon oxynitride. The buffer layer 105 may be omitted depending on the type or process condition of the substrate 100.

The semiconductor layer 110 may be disposed on the buffer layer 105. The semiconductor layer 110 forms a channel of the thin film transistor. The semiconductor layer 110 may include polycrystalline silicon. However, the present invention is not limited thereto, and the semiconductor layer 110 may include monocrystalline silicon, low-temperature polycrystalline silicon, amorphous silicon, or an oxide semiconductor. Examples of the oxide semiconductor may include two-component compounds (ABx), three-component compounds (ABxCy), and four-component compounds (ABxCyDz), each containing indium (In), zinc (Zn), gallium (Ga), tin (Sn), titanium (Ti), aluminum (Al), hafnium (Hf), zirconium (Zr), or magnesium (Mg).

The first insulating layer 121 may be a gate insulating layer having a gate insulating function. The first insulating layer 121 may include a silicon compound, a metal oxide, or the like. For example, the first insulating layer 121 may include silicon oxide, silicon nitride, silicon oxynitride, aluminum oxide, tantalum oxide, hafnium oxide, zirconium oxide, titanium oxide, or the like. These may be used alone or in combination with each other. The first insulating layer 121 may be a single-layer film or a multi-layer film formed as a laminated layer of different materials.

The first insulating layer 121 is disposed on the semiconductor layer 110. The first insulating layer 121 may be generally disposed over the entire surface of the substrate 100.

The first gate conductive layer 130 is disposed on the first insulating layer 121. The first gate conductive layer 130 may include a gate electrode 131 of a thin film transistor of the pixel PX, a scan line connected to the gate electrode 131, and a first electrode 132 of a storage capacitor. The first non-active fanout wiring ("NFW_1" in FIG. 8) of the non-active area NAR may also be included in the first gate conductive layer 130.

The first gate conductive layer 130 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), Chromium (Cr), calcium (Ca), titanium (Ti), tantalum (Ta), tungsten (W), and copper (Cu). The first gate conductive layer 130 may be a single-layer film or a multi-layer film.

The second insulating layer 122 may be disposed on the first gate conductive layer 130. The second insulating layer 122 may be an interlayer insulating film or a gate insulating film. The second insulating layer 122 may include an inorganic insulating material such as silicon oxide, silicon nitride, silicon oxynitride, hafnium oxide, aluminum oxide, titanium oxide, tantalum oxide, or zinc oxide.

The second gate conductive layer 140 is disposed on the second insulating layer 122. The second gate conductive layer 140 may include a second electrode of a storage capacitor. The second non-active fanout wiring ("NFW_2" in FIG. 8) of the non-active area NAR may also be included in the second gate conductive layer 140. The second gate conductive layer 140 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second gate conductive layer 140 may be made of or include the same material as the first gate conductive layer 130, but present invention is not limited thereto. The second gate conductive layer 140 may be a single-layer film or a multi-layer film.

The third insulating layer 123 is disposed on the second gate conductive layer 140. The third insulating layer 123 may be an interlayer insulating film. The third insulating layer 123 may include an inorganic insulating material such as silicon oxide, silicon nitride, silicon oxynitride, hafnium oxide, aluminum oxide, titanium oxide, tantalum oxide, or zinc oxide, or may include an organic insulating material such as polyacrylate resin, epoxy resin, phenolic resin, polyamide resin, polyimide rein, unsaturated polyester resin, poly phenylenether resin, polyphenylenesulfide resin, or benzocyclobutene (BCB). The third insulating layer 123 may be a single-layer film or a multi-layer film formed as a laminated layer of different materials.

The first data conductive layer 150 is disposed on the third insulating layer 123. The first data conductive layer 150 may be a first source/drain conductive layer. The first data conductive layer 150 may include a first electrode 151 and a second electrode 152 of the thin film transistor of the pixel PX. Signal wirings ("SW1" and "SW2" in FIG. 8) may also be included in the first data conductive layer 150. The first electrode 151 and second electrode 152 of the thin film transistor may be electrically connected to a source region and drain region of the semiconductor layer 110 through a contact hole penetrating the third insulating layer 123, the second insulating layer 122, and the first insulating layer 121. The first power voltage electrode 153 of the pixel PX may also be included in the first data conductive layer 150.

The first data conductive layer 150 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first data conductive layer 150 may be a single-layer film or a multi-layer film. For example, the first data conductive layer 150 may be formed to have a laminated structure of Ti/Al/Ti, Mo/Al/Mo, Mo/AlGe/Mo, or Ti/Cu.

The fourth insulating layer 124 is disposed on the first data conductive layer 150. The fourth insulating layer 124 covers the first data conductive layer 150. The fourth insulating layer 124 may be an interlayer insulating film or a via layer. The fourth insulating layer 124 may include an organic insulating material such as polyacrylate resin, epoxy resin, phenolic resin, polyamide resin, polyimide rein, unsaturated polyester resin, poly phenylenether resin, polyphenylenesulfide resin, or benzocyclobutene ("BCB").

The second data conductive layer 160 is disposed on the fourth insulating layer 124. The second data conductive layer 160 may be a second source/drain conductive layer. The second data conductive layer 160 may include a connection electrode 161 of the pixel PX. A connection wiring ("CNW" in FIG. 7) may also be included in the second data conductive layer 160. The connection electrode 161 may be electrically connected to the second electrode 152 of the thin film transistor of the pixel PX through a contact hole penetrating the fourth insulating layer 124.

The second data conductive layer 160 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second data conductive layer 160 may be a single-layer film or a multi-layer film. The second data conductive layer 160 may be made of the same material as the first data conductive layer 150, but the present invention is not limited thereto.

The fifth insulating layer 125 is disposed on the second data conductive layer 160. The fifth insulating layer 125 covers the second data conductive layer 160. The fifth insulating layer 125 may be a via layer. The fifth insulating layer 125 may include the same material as the above-described fourth insulating layer 124, or may include at least one selected from the materials illustrated as constituent materials of the fourth insulating layer 124.

The pixel electrode 170 is disposed on the fifth insulating layer 125. The pixel electrode 170 may be an anode electrode of a light emitting element. The pixel electrode 170 may be electrically connected to the connection electrode 161 included in the second data conductive layer 160 through a contact hole penetrating the fifth insulating layer 125, and may be electrically connected to the second electrode 152 of the thin film transistor. The pixel electrode 170 may at least partially overlap the light emitting area EMA of the pixel PX.

The pixel electrode 170 may have a laminated film structure in which a high-work-function material layer including Indium-Tin-Oxide ("ITO"), Indium-Zinc-Oxide ("IZO"), Zinc Oxide (ZnO), or Indium Oxide ($In_2O_3$) and a reflective material layer including silver (Ag), magnesium (Mg), aluminum (Al), platinum (Pt), palladium (Pd), gold (Au), nickel (Ni), neodium (Nd), iridium (Ir), chromium (Cr), lithium (Li), calcium (Ca), or a mixture thereof are laminated. The high-work-function material layer may be disposed above the reflective material layer to be closer to the organic layer 190. The pixel electrode 170 may have a multi-layer structure of ITO/Mg, ITO/MgF, ITO/Ag, and ITO/Ag/ITO, but the present invention is not limited thereto.

The pixel defining layer 126 may be disposed on the pixel electrode 170. The pixel defining layer 126 may at least partially overlap the non-light emitting area NEA of the pixel PX. The pixel defining layer 126 may include an opening exposing the pixel electrode 170. The pixel defining layer 126 may include an inorganic insulating material such as silicon oxide, silicon nitride, silicon oxynitride, hafnium oxide, aluminum oxide, titanium oxide, tantalum oxide, or zinc oxide, or may include an organic insulating material such as polyacrylate resin, epoxy resin, phenolic resin, polyamide resin, polyimide rein, unsaturated polyester resin, poly phenylenether resin, polyphenylenesulfide resin, or benzocyclobutene (BCB). The pixel defining layer 126 may be a single-layer film or a multi-layer film formed as a laminated layer of different materials.

A light emitting layer is disposed in the opening of the pixel defining layer 126. The light emitting layer may be made of an inorganic material or an organic material. In an exemplary embodiment, the light emitting layer may include the organic layer 190. The organic layer 190 may include an organic light emitting layer, a hole injection/transporting layer, and an electron injection/transporting layer. The organic layer 190 may overlap the light emitting area EMA.

The common electrode 180 is disposed on the organic layer 190 and the pixel defining layer 126. The common electrode 180 may be a cathode electrode of a light emitting element. The common electrode 180 may be disposed in the non-light emitting area NEA of the pixel PX as well as the light emitting area EMA of the pixel PX. That is, the common electrode 180 may be disposed over the entire surface of each pixel PX. The common electrode 180 may include a low-work-function material layer including Li, Ca, LiF/Ca, LiF/Al, Al, Mg, Ag, Pt, Pd, Ni, Au Nd, Ir, Cr, BaF, Ba, a compound thereof, or a mixture thereof (for example, a mixture of Ag and Mg). The common electrode 180 may further include a transparent metal oxide layer disposed on the low-work-function material layer.

Although not shown in the drawing, an encapsulation film may be disposed on the common electrode 180. The encapsulation film may include an inorganic film. In an embodiment, the encapsulation film may include a first inorganic layer, an organic layer on the first inorganic layer, and a second inorganic layer on the organic layer.

Figure 6:
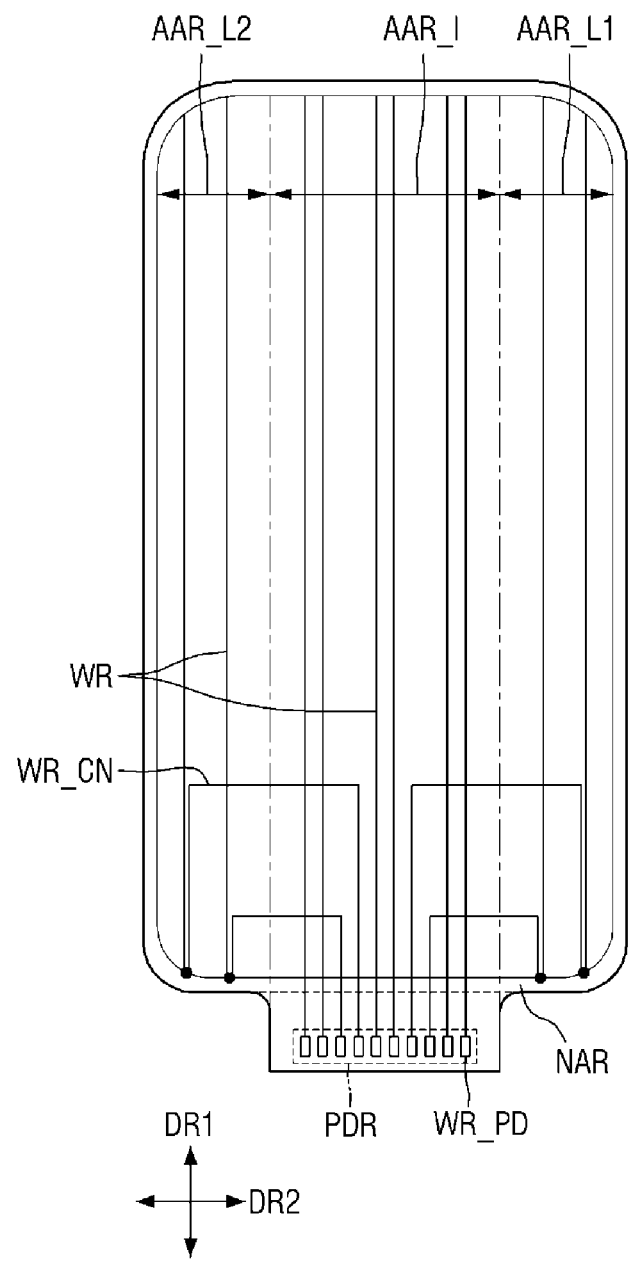
FIG. 6 is a layout view of some wirings of a display device according to an embodiment.

FIG. 6 is a layout view of some wirings of a display device according to an embodiment.

Referring to FIG. 6, the width of the pad unit PDR in the second direction DR2 in which the wiring pads WR_PD are arranged is smaller than the width of the active area AAR in the second direction DR2. In order to cover more active areas AAR, the wiring WR may be gradually extended in the second direction from the wiring pad WR_PD toward the active area AAR. That is, the total widths of the wiring pads WR_PD in the second direction increase along the first direction DR1. The most preferable arrangement of the wirings WR will be configured such that the wirings WRs extend in the second direction DR2 so as to be arranged to cover the entire active area AAR. However, when the bezel of the display device is reduced, a space in which the wirings WR are spread may be insufficient. When the display device has an L-shaped cutting shape like FIG. 6 or cannot pass through the corresponding space due to that other wirings WR are arranged at the corners, the space for extending may be insufficient. As a result, the width of the arrangement of the wirings WR in the second direction D2 extending from the pad unit PDR in the non-active area NAR adjacent to the active area AAR may be smaller than the width of the active area AAR in the second direction D2.

The active area AAR may be divided into an inner active area AAR_I and an outer active area AAR_L (AAR_L1, AAR_L2) depending on the relative relationship with the arrangement area of the wirings WR extending from the pad unit PDR in the non-active area NAR adjacent to the active area AAR. The inner active area AAR_I is defined as an active area overlapping the arrangement of the wirings WR when the arrangement of the wirings WR extending from the pad unit PDR in the non-active area NAR adjacent to the active area AAR extends to the other side (i.e., upper direction in FIG. 6) of the first direction DR1. The outer active area AAR_L is defined as an active area not overlapping the arrangement of the wirings WR when the arrangement of the wirings WR extending from the pad unit PDR in the non-active area NAR adjacent to the active area AAR extends to the other side of the first direction DR1. Although it is illustrated in the drawing that the inner active are AAR_I is located at the center of the active area AAR, the first outer active area AAR_L1 is located at one side of the inner active area AAR_I in the second direction DR2, and the second outer active area AAR_L2 is located at the other side of the inner active area AAR_I in the second direction DR2, the present invention is not limited thereto. The number and position of the inner active area AAR_I and the outer active area AAR_L may be variously changed depending on the position of the row of the wiring pad WR_PD of the pad unit PDR in another embodiment.

In the inner active area AAR_I, each wiring WR may extend in the first direction DR1 from the non-active area NAR (that is, the inner non-active area NAR) adjacent to the inner active area AAR_I, and may thus be disposed adjacent to the pixels of the corresponding area, thereby applying signals. In contrast, in the outer active area AAR_L, after each bypass wiring WR_CN may be extended from the inner non-active area NAR to the outside (one side or the other side of the second direction DR2), each wiring WR may extend in the first direction DR1 from the corresponding position (i.e., end of the bypass wiring WR_CN in the outer active area AAR_L)_, and may thus be disposed adjacent to the pixels of the corresponding area, thereby applying signals. The bypass wiring WR_CN may extend to the non-active area NAR (that is, the outer non-active area NAR) adjacent to the outer active area AAR_L through the inner active area AAR_I. Since the other wirings WR are disposed in the active area AAR through which the bypass wiring WR_CN passes, the bypass wiring WR_CN may be included in a conductive layer located on a different layer from other wirings WR of the active area AAR to prevent the short circuit between the wirings WR.

Figure 7:
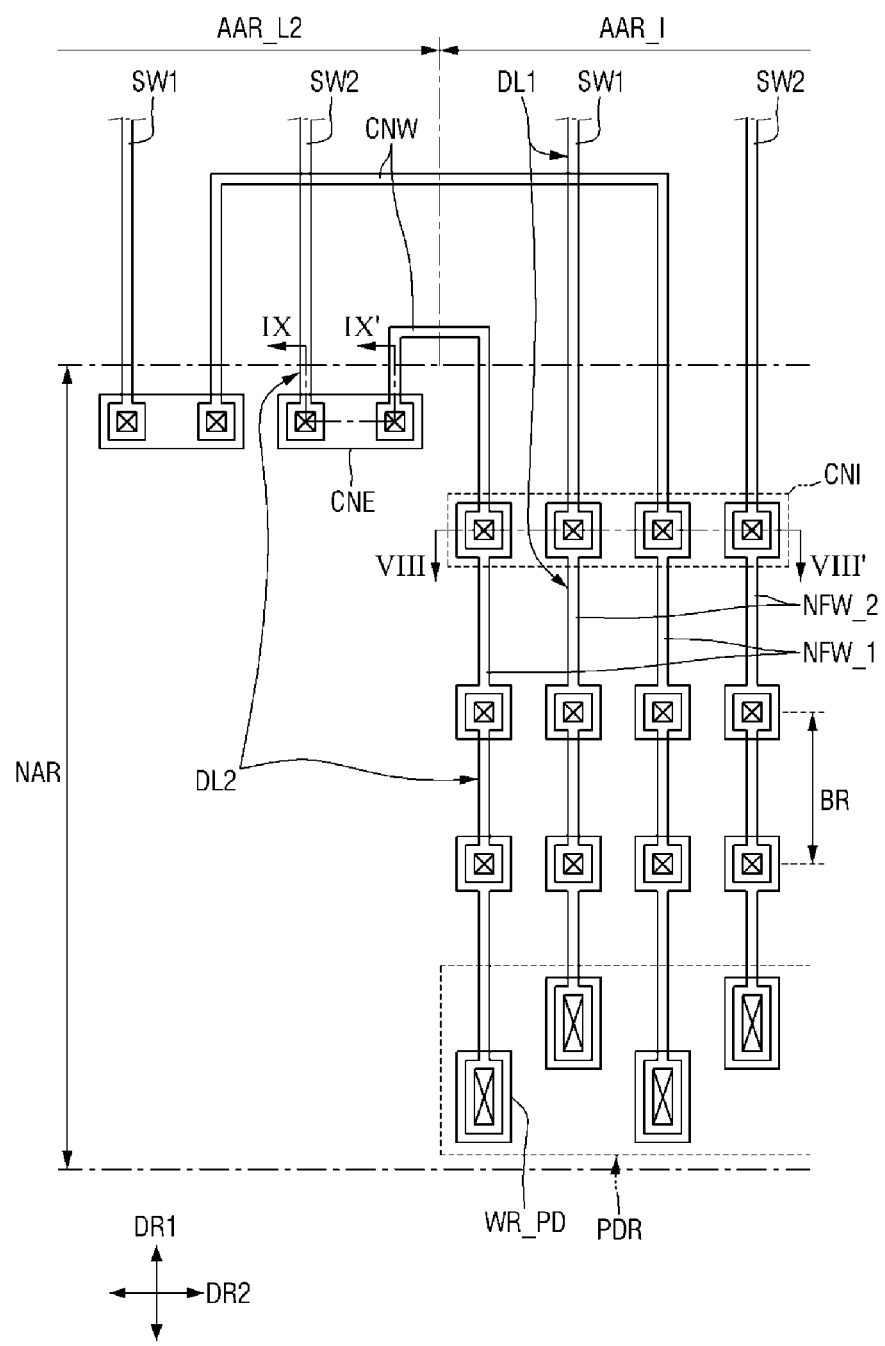
FIG. 7 is a layout view illustrating the signal wirings constituting a data line according to an embodiment.
Figure 8:
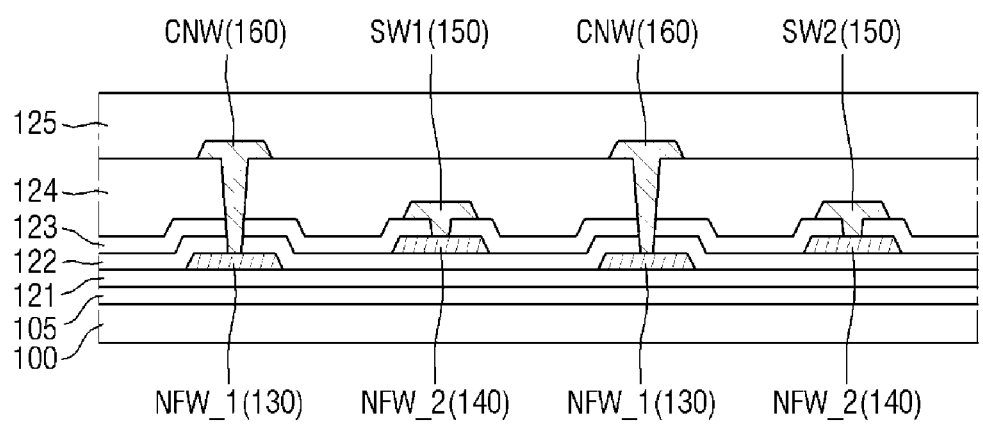
FIG. 8 is a cross-sectional view taken along line VIII-VIII' of FIG. 7.
Figure 9:
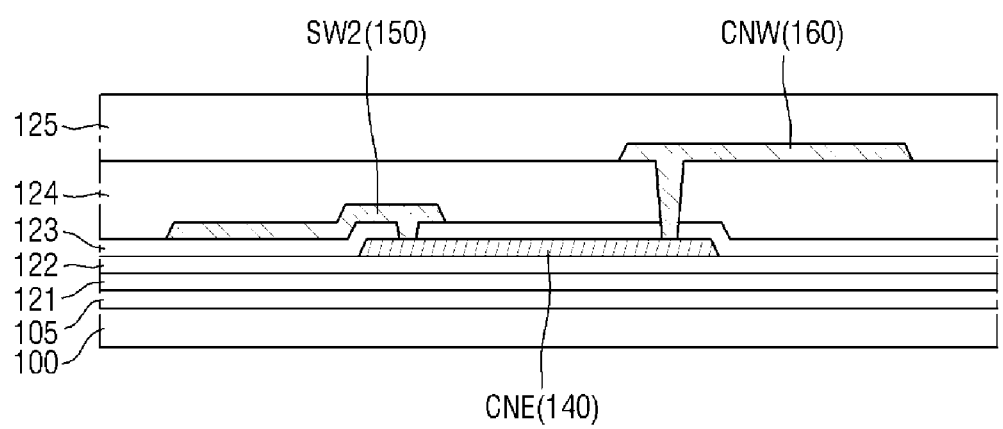
FIG. 9 is a cross-sectional view taken along line IX-IX' of FIG. 7.

FIG. 7 is a layout view illustrating the signal wirings constituting a data line according to an embodiment, FIG. 8 is a cross-sectional view taken along line VIII-VIII' of FIG. 7, and FIG. 9 is a cross-sectional view taken along line IX-IX' of FIG. 7.

Referring to FIGS. 7 to 9, the data lines DL includes a first data line DL1 providing a first data signal to the pixels PXs belonging to the first pixel column PXC1, and a second data line DL2 providing a second data signal to the pixels PX belonging to the second pixel column PXC2. The first data line DL1 and the second data line DL2 may be connected from the pad unit PDR to the pixel PX of the active area AAR using a plurality of conductive layers. The first data line DL1 and the second data line DL2 may be alternately arranged one by one along the second direction DR2 throughout the active area AAR.

Each of the first data line DL1 and the second data line DL2 may be divided into an inner data line and an outer data line. The inner data line may be a data line that provides a data signal to the pixels PX located in the inner active area AAR_I, and the outer data line may be a data line that provides a data signal to the pixels PX located in the outer active area AAR_L.

The inner data line may include non-active fanout wirings NFW_1 and NFW_2 and signal wirings SW1 and SW2. The non-active fanout wirings NFW_1 and NFW_2 may be disposed in the inner non-active area NAR, and the signal wirings SW1 and SW2 may be disposed from the inner non-active area NAR to the active area AAR.

The first data line DL1 corresponding to the inner data line may include a second non-active fanout wiring NFW_2 and a first signal wiring SW1. The second data line DL2 corresponding to the inner data line may include a first non-active fanout wiring NFW_1 and a second signal wiring SW2.

The first non-active fanout wiring NFW_1 and the first signal wiring SW1 of the inner data line may be connected to each other and the second non-active fanout wiring NFW_2 and the second signal wiring SW2 of the inner data line may be connected to each other at an inner wiring contact portion CNI located in the non-active area NAR adjacent to the inner active area AAR_I. In the inner wiring contact portion CNI, the first non-active fanout wiring NFW_1 and the first signal wiring SW1 of the inner data line may be in direct contact with each other, and the second non-active fanout wiring NFW_2 and the second signal wiring SW2 of the inner data line may be in direct contact with each other.

The outer data line may further include a connection wiring CNW which is a bypass wiring ('WR_CN' in FIG. 6) in addition to the non-active fanout wirings NFW_1 and NFW_2 and the signal wirings SW1 and SW2. The non-active fanout wirings NFW_1 and NFW_2 may be disposed at the inner non-active area NAR, and the signal wirings SW1 and SW2 and the connection wiring CNW may be disposed from the inner non-active area NAR to the active area AAR.

The first data line DL1 corresponding to the outer data line may include the first non-active fanout wiring NFW_1, the connection wiring CNW, and the first signal wiring SW1. The second data line DL2 corresponding to the outer data line may include the second non-active fanout wiring NFW_2, the connection wiring CNW, and the second signal wiring SW2. The connection wiring CNW may be an active fanout wiring passing through the active area AAR.

The connection wiring CNW and non-active fanout wirings NFW_1 and NFW_2 of the outer data line may be connected to each other in the inner wiring contact portion CNI located in the inner non-active area NAR. At the inner wiring contact portion CNI, each of the non-active fanout wirings NFW_1 and NFW_2 and the connection wiring CNW may be in direct contact with each other. The connection wiring CNW and the signal wirings SW1 and SW2 may be connected to each other at an outer wiring contact portion located in the non-active area NAR adjacent to the outer active area AAR_L. At the outer wiring contact portion, the connection wiring CNW and each of the signal wirings SW1 and SW2 may be connected through a contact electrode CNE. However, the present invention is not limited thereto, and the connection wiring CNW and the signal wiring SW1 and SW2 may be in direct contact with each other without the contact electrode CNE at the outer wiring contact portion in another embodiment. In this case, at the outer wiring contact portion, at least one of the connection wiring CNW and the signal wirings SW1 and SW2 further includes a structure (for example, a bending portion bent in the second direction DR2 from the wiring) corresponding to the shape of the illustrated contact electrode CNE.

The above-described inner data line, which is a data line in which the fanout wirings NFW_1 and NFW_2 are directly connected to and the signal wirings SW1 and SW2, respectively, without the connection wiring CNW crossing the active area AAR, may be referred to as a direct connection type data line or a direct line. In contrast, the outer data line, which is a data line in which the non-active fanout wirings NFW_1 and NFW_2 are connected to the signal wirings SW1 and SW2, respectively, through the connection wiring CNW, may be referred to as an indirect connection type data line, a via-type data line, or an indirect data line.

The non-active fanout wiring NFW_1 and NFW_2, the signal wirings SW1 and SW2, and the connection wiring CNW may be included in conductive layers located on different layers from each other. In an embodiment, the non-active fanout wirings NFW_1 and NFW_2 may be included in the gate conductive layers 130 and 140, and the signal wirings SW1 and SW2 and the connection wiring CNW may be included in different data conductive layers 150 and 160.

Specifically, regardless of whether the data line is an inner or outer data line, the first non-active fanout wiring NFW_1 may be included in the first gate conductive layer 130, and the second non-active fanout wiring NFW_2 may be included in the second gate conductive layer 140. However, the present invention is not limited thereto, and the first non-active fanout wiring NFW_1 may be included in the second gate conductive layer 140, and the second non-active fanout wiring NFW_2 may be included in the first gate conductive layer 130.

Regardless of whether the data line is an inner or outer data line, both the first signal wiring SW1 and the second signal wiring SW2 may be included in the first data conductive layer 150, and the connection wiring CNW may be included in the second data conductive layer 160. However, the applied conductive layers may be reversed.

Although it is illustrated in the drawing that the connection wiring CNW is included in one conductive layer and the signal wiring SW (e.g., SW1, SW2) is made of a different conductive layer from the connection wiring CNW, the present invention is not limited thereto. In some embodiments, the connection wiring CNW is partially separated and made of one or more conductive layers, and some of these separated connection wirings CNW may be made of the same conductive layer as the signal wiring SW. For example, portions of the connection wiring CNW extending in the first direction DR1 in the same manner as the signal wiring SW may be included in a conductive layer disposed on the same layer as the signal wiring SW, and portions of the connection wiring CNW extending in the second direction DR2 may be included in a conductive layer disposed on a different layer from the signal wiring SW.

The contact electrode CNE may be included in a conductive layer disposed on a different layer from the connection wiring CNW and the signal wirings SW1 and SW2. For example, as shown in the drawing, the contact electrode CNE may be included in the second gate conductive layer 140, but may also be included in the first gate conductive layer 130.

The non-active fanout wirings NFW_1 and NFW_2 are connected to the wiring pad WR_PD, and may extend to another conductive layer in the middle. For example, after passing the bending area BR through the first data conductive layer 150 or the second data conductive layer 160, in the sub-area SR, the bending area BR may extend using the first gate conductive layer 130 or the second gate conductive layer 140. The wiring pad WP_PD may include the gate conductive layers 130 and 140 and the data conductive layers 150 and 160 connected to the gate conductive layers 130 and 140 through a contact hole. When the conductive layer is changed in the extension portion of the wiring, a contact hole connecting between the conductive layers may be defined in the corresponding portion.

Figure 10:
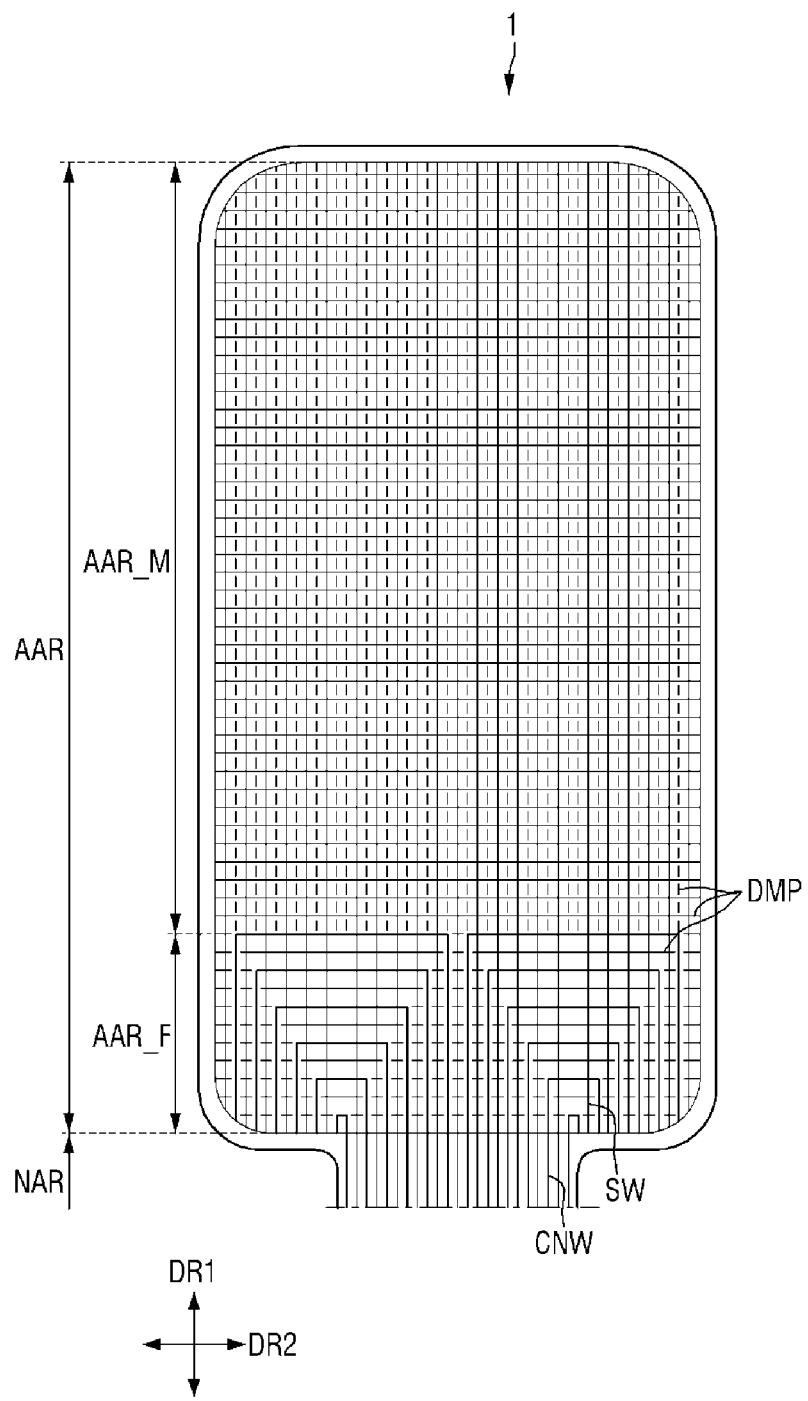
FIG. 10 is a schematic layout view illustrating the arrangement of a plurality of wirings arranged in an active area of a display device according to an embodiment.

FIG. 10 is a schematic layout view illustrating the arrangement of a plurality of wirings arranged in an active area of a display device according to an embodiment. In FIG. 10, for convenience of description, only the relative arrangement of connection wirings CNW, dummy wiring patterns DMP and signal wirings SW, which are arranged in the active area AAR, is illustrated.

Referring to FIG. 10, a plurality of wirings may be arranged in the active area AAR of the display device 1 to cross each other. In the active area AAR, an active fanout area AAR_F in which the connection wirings CNW are arranged may be defined in an area adjacent to the non-active area NAR in which the non-active fanout wirings NFW_1 and NFW_2 are arranged. In the active area AAR, a main active area AAR_M in which the connection wirings CNW are not arranged may be defined in an area other than the active fanout area AAR_F. The connection wirings CNW arranged in the active fanout area AAR_F may be arranged to connect the non-active fanout wirings NFW_1 and NFW_2 disposed in the inner active area AAR_I and the signal wirings SW disposed in the outer active area AAR_L, and may thus be arranged in only a portion of the active area AAR. Unlike the signal wiring SW extending in the first direction DR1, the connection wiring CNW may include a portion extending in the second direction DR2, and thus defects in which the wirings extending in the second direction DR2 are visually recognized (with naked eyes) may occur in the area where only the connection wiring CNW is disposed.

In order to prevent the defects, dummy wiring patterns DMP having a similar shape to the connection wiring CNW may be arranged in the main active area AAR_M other than the active fanout area AAR_F. The dummy wiring patterns DMP may extend in the first direction DR1 or the second direction DR2. The dummy wiring patterns DMP may be included in a conductive layer located on the same layer as the connection wirings CNW, and some of the dummy wiring patterns DMP may be arranged between the connection wirings CNW in the active fanout area AAR_F. The dummy wiring patterns DMP may prevent the active fanout area AAR_F in which the connection wirings CNW are arranged and the main active area AAR_M from being separately viewed on the entire surface of the active area AAR. Hereinafter, arrangement structures of wirings of the display device 1 will be described in detail with reference to other drawings.

Figure 11:
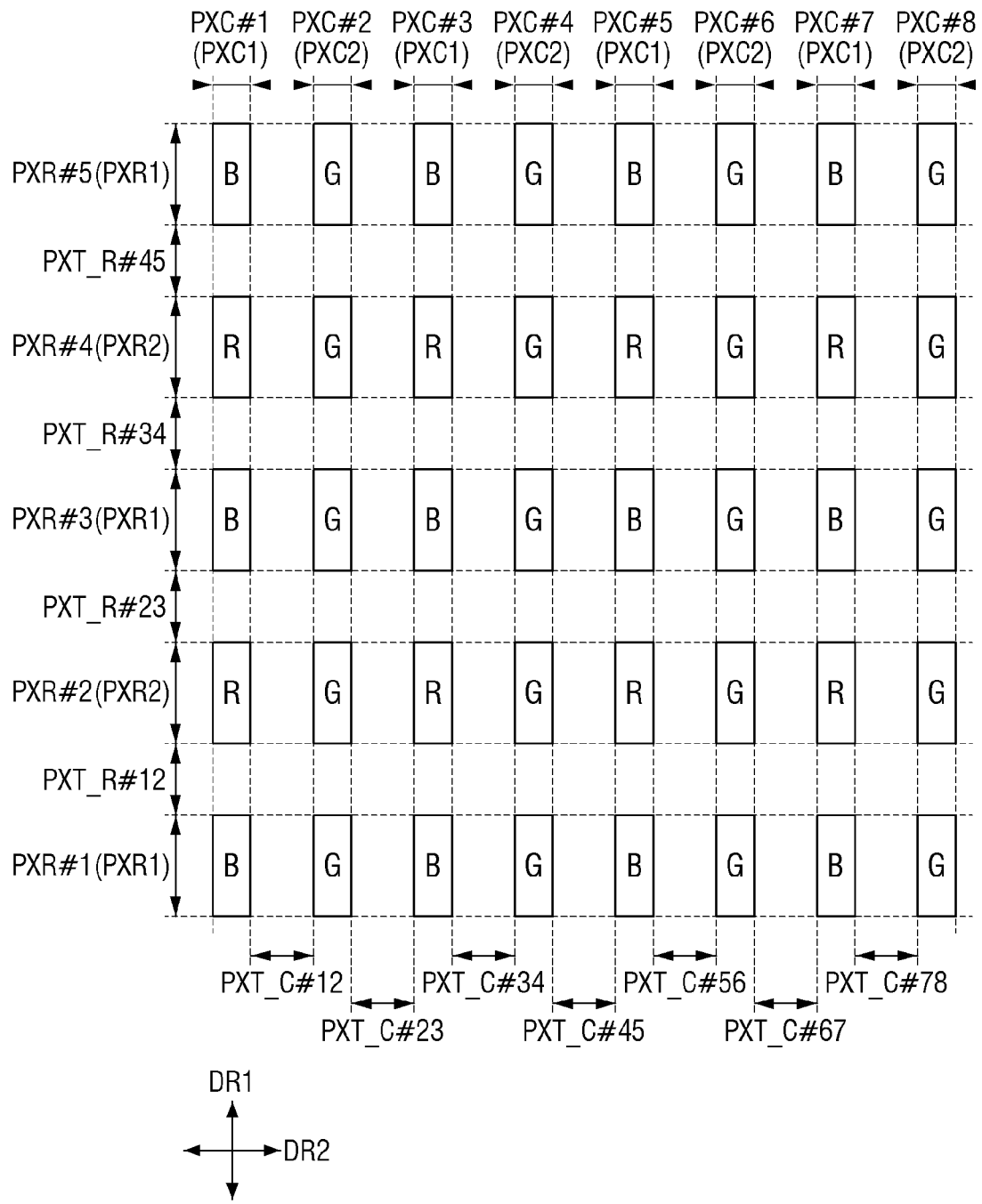
FIG. 11 is a partial layout view illustrating a pixel arrangement according to an embodiment.
Figure 12:
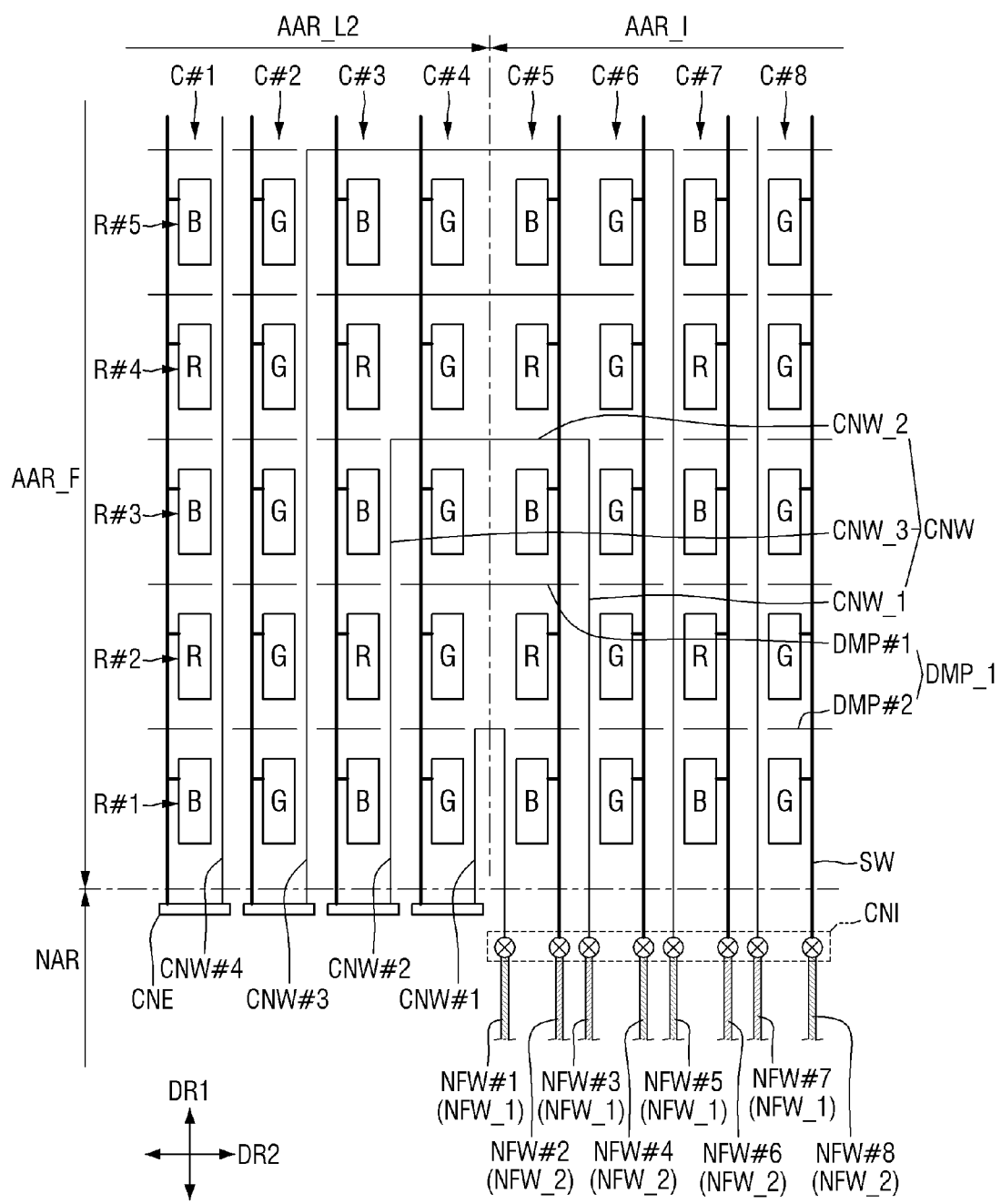
FIG. 12 is a partial layout view illustrating the arrangement of data lines in the pixel arrangement of FIG. 11.
Figure 13:
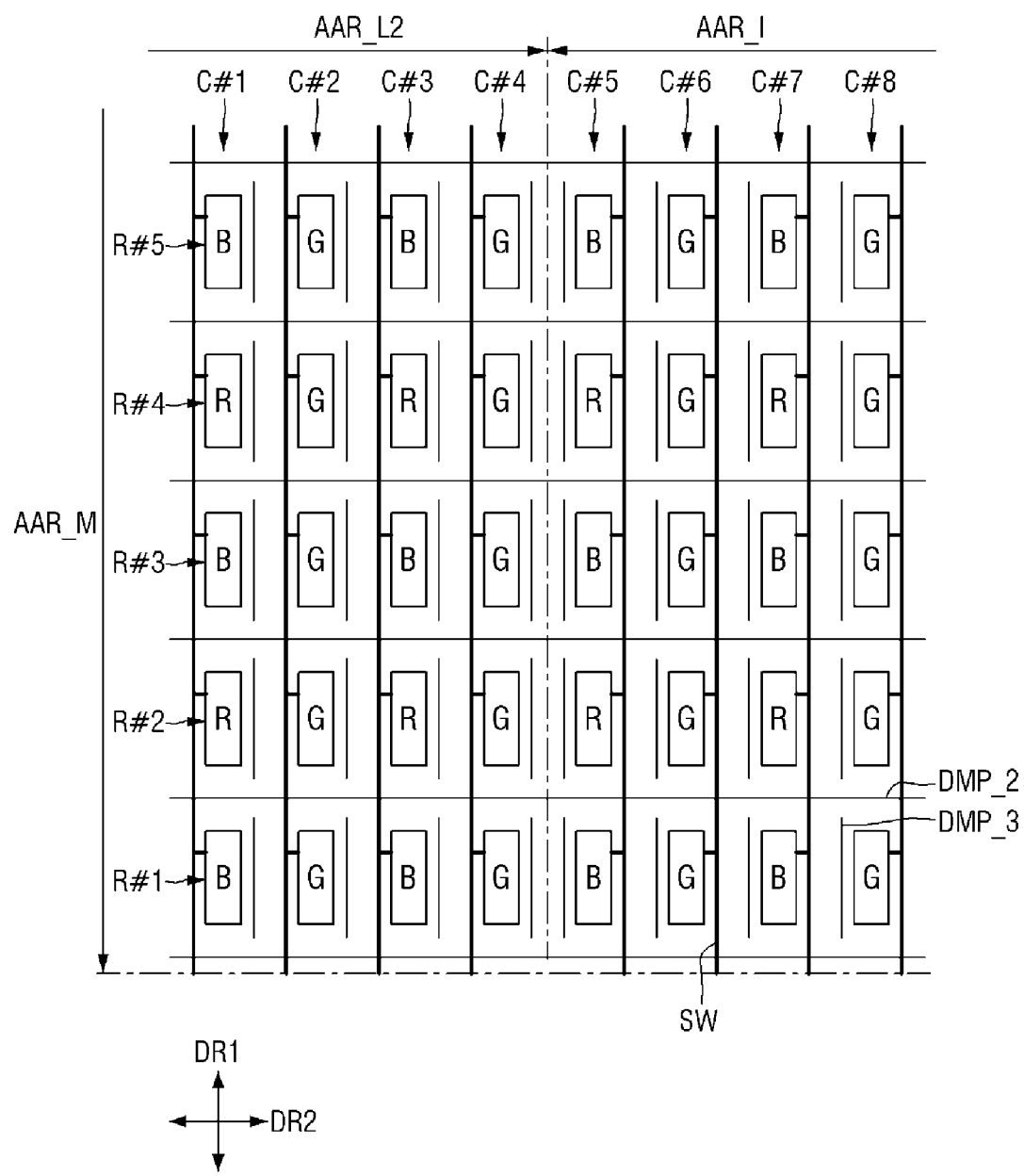
FIG. 13 is a schematic layout view illustrating the arrangement of dummy wiring patterns arranged in a main active area of a display device according to an embodiment.

FIG. 11 is a partial layout view illustrating a pixel arrangement according to an embodiment, FIG. 12 is a partial layout view illustrating the arrangement of data lines in the pixel arrangement of FIG. 11, and FIG. 13 is a schematic layout view illustrating the arrangement of dummy wiring patterns arranged in a main active area of a display device according to an embodiment. In FIGS. 11 to 13, for convenience of description, the shape of each pixel is simplified to a rectangle. FIG. 12 illustrates data lines arranged in the pixel arrangement of FIG. 11 in the active fanout area AAR_F, and FIG. 13 illustrates dummy wiring patterns DMPs and signal wirings SW arranged in the pixel arrangement of FIG. 11 in the main active area AAR_M. FIGS. 11 to 13 conceptually illustrate a space covered by one pixel PX irrespective of the shape of the light emitting area EMA of each pixel PX, which may be applied in the same manner not only in the case where the light emitting area EMA of each pixel PX has an actual rectangular shape but also in the case where the light emitting area EMA of each pixel PX has a staggered arrangement.

Referring to FIGS. 11 to 13, the first signal line SW1 and the second signal line SW2 may be disposed along a boundary (or a space between pixels) of the pixel PX. Here, the boundary of the pixel PX is an edge of a space occupied by the pixel PX, and may refer to a space outside the light emitting area EMA of the pixel PX. In the following embodiments, a case where the signal wirings SW1 and SW2 are arranged at the boundary of the pixel PX is exemplified, but the signal wirings SW1 and SW2 may be arranged to partially overlap the light emitting area EMA of the pixel PX in another embodiment. When the display device is a front emission type display device, even if the signal wirings SW1 and SW2 cross the pixel PX and overlap the light emitting area EMA, the light emission luminance may not be affected.

The first signal wiring SW1 and the second signal wiring SW2 providing data signals to a plurality of pixel columns, for example, first to fourth pixel columns PXC #1, PXC #2, PXC #3, and PXC #4, arranged in the outer active area AAR_L ('AAR_L2' in FIGS. 12 and 13) of the active area AAR may be disposed adjacent to the other side of each pixel column PXC in the second direction DR2. In contrast, the first signal wiring SW1 and the second signal wiring SW2 providing data signals to a plurality of pixel columns, for example, fifth to eighth pixel columns PXC #5, PXC #6, PXC #7, and PXC #8, arranged in the inner active area AAR_I of the active area AAR may be disposed adjacent to one side of each pixel column PXC in the second direction DR2. However, the present invention is not limited thereto, and the first signal line SW1 and the second signal line SW2 may be disposed at one side or the other side of each pixel column PXC in the second direction DR2 in the same manner. Alternatively, the first signal line SW1 and the second signal line SW2 may be alternately arranged at one side or the other side of each pixel column PXC in the second direction DR2.

The first signal wiring SW1 and the second signal wiring SW2 may be arranged in spaces PXT_C #12, PXT_C #23, PXT_C #34, PXT_C #45, PXT_C #56, PXT_C #67, and PXT_C #78 among the pixel columns, respectively. However, the signal wrings SW1 and SW2 may not be arranged in the space PXT_C #45 between pixel columns located at the boundary between the outer active area AAR_L2 and the inner active area AAR_I. The signal lines SW may be arranged in a symmetrical structure based on the boundary between the inner active area AAR_I and the outer active area AAR_L2.

The connection wiring CNW may be disposed along the boundary of the pixel PX in the active area AAR. The connection wiring CNW may include a bent structure. In an embodiment, the connection wiring CNW may include a first extension portion CNW_1 and a third extension portion CNW_3, extending in the first direction DR1, and a second extension portion CNW_2 extending in the second direction DR2.

The first extension portion CNW_1 may extend from the inner non-active area NAR to the inner active area AAR_I (that is, one side of the first direction DR1). The first end of the first extension portion CNW_1 may be located in the inner non-active area NAR, and the second end thereof may be located in the inner active area AAR_I. The first end of the first extension portion CNW_1 may be connected to the non-active fanout wiring NFW at the inner wiring contact portion CNI.

The second extension portion CNW_2 may be connected to the first extension portion CNW_1 and may extend to the other side (or one side) in the second direction DR2. The second extension portion CNW_2 may extend from the inner active area AAR_I to the outer active area AAR_L2. The first end of the second extension portion CNW_2 may be located in the inner active area AAR_I, and the second end thereof may be located in the outer active area AAR_L2. The first end of the second extension portion CNW_2 may be connected to the second end of the first extension portion CNW_1. A first bent portion of the connection wiring CNW may be disposed at the first end of the second extension portion CNW_2 and/or the second end of the first extension portion CNW_1. The entire second extension portion CNW_2 may be disposed in the active area AAR.

The third extension portion CNW_3 may be connected to the second extension portion CNW_2, and may extend from the outer active area AAR_L2 to the outer non-active area NAR (that is, one side of the first direction DR1). The first end of the third extension portion CNW_3 may be located in the outer active area AAR_L2, and the second end thereof may be located in the outer non-active area NAR. The first end of the third extension portion CNW_3 may be connected to the second end of the second extension portion CNW_2. A second bent portion of the connection wiring CNW may be disposed at the first end of the third extension portion CNW_3 and/or the second end of the second extension portion CNW_2. The second end of the first extension portion CNW_1 may be connected to the contact electrode CNE and/or the signal wirings SW1 and SW2 connected thereto at the outer wiring contact portion.

As the signal wirings SW1 and SW2 of the outer data line are further away from the inner active area AAR_I, the signal wirings SW1 and SW2 of the outer data line may be connected to the non-active fanout wiring NFW disposed farther away from the inner active area AAR_I. That is, among the signal wirings SW1 and SW2 of the plurality of outer data lines, the signal wirings SW1 and SW2 adjacent to the inner active area AAR_I may be connected to the relatively close non-active fanout wiring NFW. As the signal wirings SW1 and SW2 of the outer data line are farther away from the other side of the second direction DR2, the non-active fanout wiring NFW located at one side of the second direction DR2 may be connected thereto. The connection wiring CNW of the outer data line located at a relatively outer side may be disposed in a shape surrounding the connection wiring CNW of the outer data line located at the inner side in a plan view.

In FIG. 12, a pixel arrangement of a 5 row 8 column structure located in the second outer active area AAR_L2 and the inner active area AAR_I adjacent thereto is illustrated. The wiring arrangement of the first outer active area AAR_L1 and the inner active area AAR_I adjacent thereto may have a generally symmetrical relationship with respect to the wiring arrangement of FIG. 12.

In the drawings, the leftmost column is referred to as column 1, and the column number increases rightward. Further, in the drawings, the lowermost row is referred to as row 1, and the row number increases upward. The inter-pixel space is described by writing the left pixel number of adjacent pixels. For example, the space between the first pixel and the second pixel is described as a 'first space'. The connection wiring CNW is numbered in the order in which a path is short.

The first, third, fifth, and seventh pixel columns PXC #1, PXC #3, PXC #5, and PXC #7 correspond to the first pixel columns PXC1, and the second, fourth, sixth, and eighth pixel columns PXC #2, PXC #4, PXC #6, and PXC #8 correspond to the second pixel columns PXC2. The first to fourth pixel columns PXC #1, PXC #2, PXC #3, and PXC #4 are pixel columns PXC disposed in the outer active area AAR_L2, and the fifth to eighth pixel columns PXC #5, PXC #6, PXC #7, and PXC #8 are pixel columns PXCs disposed in the inner active area AAR_I. In the drawing, each pixel column PXC is expressed as C #n (n is an integer of 1 to 8), but these may be understood to mean pixel first to eighth columns (PXC #1 to PXC #8), respectively.

Similarly, the plurality of pixel rows PXRs arranged in the active area AAR are also defined as the first pixel row PXR #1 from the other side of the first direction DR1, and may be referred to as the second to fifth pixel rows PXR #2, PXR #3, PXR #4, and PXR #5 toward the one side of the first direction DR1. In the drawing, each pixel row PXR is expressed as 'R #n (n is an integer of 1 to 5)', but these may be understood to mean pixel first to fifth rows (PXR #1 to PXR #5), respectively.

Eight non-active fanout wirings NFW are arranged in the inner non-active area NAR. In the drawing, the first, third, fifth, and seventh non-active fanout wirings NFW #1, NFW #3, NFW #5, and NFW #7 from the left side are first non-active fanout wirings NFW_1 belonging to the second data line DL2 connected to the second pixel column PX2 connected to the connection wiring CNW. In the drawing, the second, fourth, sixth, and eight non-active fanout wirings NFW #2, NFW #4, NFW #6, NFW #8 from the left side are second non-active fanout wirings NFW #2 belonging to the first data line DL1 directly connected to the signal wiring SW.

The first non-active fanout wiring NFW #1 is connected to the signal wiring SW connected to the fourth pixel column PXC #4 through the first connection wiring CNW #1. The first extension portion CNW_1 of the first connection wiring CNW #1 is disposed in a space PXT_C #45 between the fourth pixel columns PXC #1 in the first pixel row PXR #1. The second extension portion CNW_2 of the first connection wiring CNW #1 is disposed from a space PXT_C #45 between the fourth pixel columns to a space PXT_R #12 between the first pixel rows. The third extension portion CNW_3 of the first connection wiring CNW #1 is disposed in a space PXT_C #45 between the fourth pixel columns PXC #1 in the first pixel row PXR #1, and is disposed at the other side of the first extension portion CNW_1 in the second direction DR2. The third extension portion CNW_3 of the first connection wiring CNW #1 is connected to the signal wiring SW disposed in a space PXT_R #34 between the third pixel columns through the contact electrode CNE.

The second non-active fanout wiring NFW #2 is connected to the signal wiring SW disposed in the space PXT_C #56 between the fifth pixel columns and connected to the fifth pixel column PXC #5.

Similarly, the third, fifth and seventh non-active fanout wirings NFW #3, NFW #5, and NFW #7 are connected to the second connection wiring CNW #2, the third connection wiring CNW #3, and the fifth connection wiring CNW #4, respectively. The non-active fanout wirings 4, 6, and 8 NFW #4, NFW #6, and NFW #8 may be directly connected to the signal wirings SW, respectively.

The first extension portion CNW_1 and the third extension portion CNW_3 of the connection wiring CNW may be spaces PXT_C #12, C #23, C #34, C #45, C #56, C #67, C #78 among the pixel columns in the active area AAR. In contrast, the second extension portion CNW_2 of the connection wiring CNW may be disposed only in a space between some pixel rows of the space PXT_R between the pixel rows of the active area AAR.

The first extension portion CNW_1 and the third extension portion CNW_3 of the connection wiring CNW, passing through the space between the pixel columns PXT_C, do not overlap the signal wirings SW1 and SW2, but the second extension portion CNW_2 of the connection wiring CNW, passing through the space PXT_R between the pixel rows, may intersect the signal wirings SW1 and SW2 and partially overlap the signal wirings SW1 and SW2 at the corresponding intersections.

The connection wirings CNW connected to the different signal wiring SW1 and SW2 are arranged to be spaced apart from each other so as not to be short-circuited with each other. In an embodiment, the first extension portions CNW_1 and third extension portions CNW_3 of the connection wirings CNW are arranged in the space PXT_C between the respective pixel columns, whereas the second extensions CNW_2 thereof may be disposed one by one per space PXT_R between at least two pixel rows.

For example, the first extension portion CNW_1 and third extension portion CNW_3 of the first connection wiring CNW #1 are disposed in the space PXT_C #45 between the fourth pixel columns. The first extension portion CNW_1 of the second connection wiring CNW #2 is disposed in the space PXT_C #56 between the fifth pixel columns, and the third extension portion CNW_3 thereof is disposed in the space PXT_C #34 between the third pixel columns. Similarly, the first extension portion CNW_1 and the third extension portion CNW_3 of the third connection wiring CNW #3 and the fourth connection wiring CNW #4 may be disposed in spaces PXT_C #12, PXT_C #23, PXT_C #67, and PXT_C #78 among the respective pixel columns. The interval between the first extension portions CNW_1 or the third extension portions CNW_3 of the first to fourth connection wirings CNW #1, CNW #2, CNW #3, and CNW #4 may be constant. One pixel column PXC may be disposed between the first extension portions CNW_1, and the interval therebetween may be similar to the width of each pixel PX in the second direction DR2.

In contrast, the second extension portions CNW_2 of the connection wiring CNW may be disposed one by one per space PXT_R between at least two pixel rows. For example, the second extension portion CNW_2 of the first connection wiring CNW #1 may be disposed from a space PXT_C #45 between the fourth pixel columns to a space PXT_R #12 between the first pixel rows, and the second extension portion CNW_2 of the second connection wiring CNW #2 may be disposed from a space between the third pixel columns PXT_C #34 to a space between the third pixel rows PXT_R #34 through a space between the fifth pixel columns. The second extension portion CNW_2 of the connection wiring CNW may not be disposed in a space PXT_R #23 between the second pixel rows. Similarly, the second extension portion CNW_2 of the third connection wiring CNW #3 may be disposed in the space PXT_R between the fifth pixel rows, and the second extension portion CNW_2 of the connection wiring CNW may not be disposed in the space PXT_R #45 between the fourth pixel rows. Here, for example, "between the first pixel rows" can be defined to mean "between the first and second pixel rows."

Thus, at least two pixel rows PXRs may be disposed between the second extension portions CNW_2 of the neighboring first to fourth connecting wires CNW #1, CNW #2, CNW #3, and CNW #4.

Meanwhile, as described above, the connection wiring CNW may be disposed only in the active fanout area AAR_F adjacent to the non-active area NAR among the active areas AAR. In this case, appearance defects in which the connection wirings CNW arranged only in a portion of the entire active area AAR are visually recognized from the outside may occur. In order to prevent the appearance defects, a plurality of dummy wiring patterns DMP (DMP_1, DMP_2, and DMP_3) may be disposed on the front surface of the active area AAR.

The dummy wiring pattern DMP may be included in the same conductive layer as the connection wiring CNW. When the connection wiring CNW is included in the second data conductive layer 160, the dummy wiring pattern DMP is also included in the second data conductive layer 160. The dummy wiring pattern DMP may be formed together (simultaneously) with the connection wiring CNW.

The dummy wiring pattern DMP may be separated from the connection wiring CNW. That is, the dummy wiring pattern DMP is formed on the same layer as the connection wiring CNW, but may be disposed to be spaced apart from the connection wiring CNW. The dummy wiring pattern DMP may be a floating wiring pattern that does not directly receive an electrical signal. However, the present invention is not limited to, and the dummy wiring patterns DMP may be connected to a portion of the connection wiring CNW.

The dummy wiring pattern DMP may include a first dummy wiring pattern DMP_1 and a second dummy wiring pattern DMP_2 which extend in the second direction DR2, and a third dummy wiring pattern DMP_3 which extends in the first direction DR1. The first dummy wiring pattern DMP_1 may be disposed in the active fanout area AAR_F, and the second dummy wiring pattern DMP_2 and the third dummy wiring pattern DMP_3 may be disposed in the main active area AAR_M.

The first dummy wiring pattern DMP_1 may be disposed in the space PXT_R between pixel rows in the active fanout area AAR_F. The first dummy wiring pattern DMP_1 is disposed in the space PXT_R between the pixel rows in which the second extension portion CNW_2 of the connection wiring CNW is not disposed, so, in the active fanout area AAR_F, only the second extension portion CNW_2 of the connection wiring CNW may be mitigated from being viewed from the outside.

The first dummy wiring pattern DMP_1 may include a first sub-pattern DMP #1 disposed between second extension portions CNW_2 of different connection wirings CNW. The first sub-pattern DMP #1 may be disposed to extend in the direction DR2 in the spaces PXT_R #23 and PXT_R #45 between the second pixel row and the fourth pixel row, which are spaces PXT_R between pixel rows in which second extension portions CNW_2 are not disposed. The first sub-pattern DMP #1 may be disposed over the plurality of neighboring pixels PX in the space PXT_R between pixel rows in the second direction DR2. For example, the first sub-pattern DMP #1 disposed between the first connection wiring CNW #1 and the second extension portion CNW_2 of the second connection wiring CNW #2 may be disposed in a space PXT_R #23 between the second pixel rows, and may be disposed over the fourth pixel column PXC #4 and the fifth pixel column PXC #5. The first sub-pattern DMP #1 may have a length extending in the second direction DR2 greater than the width of each pixel column PXC or the pixel PX in the second direction DR2.

Further, the first dummy wiring pattern DMP_1 is disposed in a space PXT_R between the same pixel rows as the second extension portions CNW_2 of the connection wiring CNW, and may include a second sub-pattern DMP #2 disposed in a space PXT_C between pixel columns in which the second extension portion CNW_2 is not disposed. For example, the second extension portion CNW_2 of the first connection wiring CNW #1 is disposed from a space PXT_C #45 between the fourth pixel columns to a space PXT_R #12 between the first pixel rows. The second sub-pattern DMP #2 may be disposed from a space PXT_R #12 between the first pixel rows to a space between other pixel columns other than the space PXT_C #45 between the fourth pixel columns. The second sub-pattern DMP #2 may have a length extending in the second direction DR2 substantially equal to the width of each pixel column PXC or the pixel PX in the second direction DR2. The first dummy wiring patterns DMP_1 may be included in a conductive layer disposed on the same layer as the connection wiring CNW, and may be disposed to be spaced apart from the connection wirings CNW so as to prevent electrical short circuit due to the intersection with the connection wirings CNW. Here, for example, "between the fourth pixel columns" can be defined to mean "between the fourth and fifth pixel columns."

The second dummy wiring pattern DMP_2 may be disposed in the main active area AAR_M and may extend in the second direction DR2. The second dummy wiring pattern DMP_2 is disposed in the space PXT_R between pixel rows of the main active area AAR_M and extends in the second direction DR2. As the second dummy wiring pattern DMP_2 is disposed from the outer active area AAR_L2 to the inner active area AAR_I, the second dummy wiring pattern DMP_2 may be disposed in a plurality of pixel columns PXC and a space PXT_C between the pixel columns. Accordingly, the second dummy wiring pattern DMP_2 may intersect the signal wirings SW.

The third dummy wiring pattern DMP_3 may be disposed in the main active area AAR_M and extend in the first direction DR1. The third dummy wiring pattern DMP_3 is disposed in a space PXT_C between pixel columns of the main active area AAR_M, and may be spaced apart from the second dummy wiring pattern DMP_2 not to intersect the second dummy wiring pattern DMP_2. The third dummy wiring patterns DMP_3 may be disposed to lie on an extension line extending in the first direction DR1 of the first extension portions CNW_1 or the third extension portions CNW_3 of the connection wirings CNW. Accordingly, the third dummy wiring pattern DMP_3 is not disposed in the space PXT_R between the pixel rows, and may be disposed at one side of the adjacent pixel PX in the second direction DR2 in space PXT_C. between the pixel columns. For example, the third dummy wiring patterns DMP_3 may be disposed on opposite side of the second direction DR2 based on the signal wiring SW providing a data signal to each pixel PX and the corresponding pixel PX. However, the present invention is not limited thereto.

The second dummy wiring pattern DMP_2 disposed in the main active area AAR_M may be disposed as one extension line that is not separated, and the first dummy wiring pattern DMP_1 and the third dummy wiring pattern DMP_3 may include a plurality of patterns separated from each other so as not to intersect with other wirings arranged on the same layer. In an embodiment, the length of the second dummy wiring pattern DMP_2 measured in the second direction DR2 may be longer than the length of each first dummy wiring pattern DMP_1 measured in the second direction DR2. Further, the length of the second dummy wiring pattern DMP_3 measured in the second direction DR2 may be longer than the length of the third dummy wiring pattern DMP_3 measured in the first direction DR1, and may be longer than the length of the second extension portion CNW_2 of the connection wiring CNW.

In the active area AAR, dummy wiring patterns DMP each having a similar shape to the connection wiring CNW are disposed in correspondence with the connection wiring CNW. Among them, a plurality of wires extending in the second direction DR2 may be arranged in the active fanout area AAR_F and the main active area AAR_M. The second extension portion CNW_2 of the connection wiring CNW and the first dummy wiring patterns DMP_1 may be disposed in the active fanout area AAR_F, and the second dummy wiring patterns DMP_2 may be disposed in the main active area AAR_M.

The connection wiring CNW and the dummy wiring patterns DMP may be included in a conductive layer disposed on the same layer, for example, the second data conductive layer 160. The fifth insulating layer 125 is disposed on the second data conductive layer 160, and the pixel electrode 170 is disposed on the fifth insulating layer 125. As described above, the second dummy wiring pattern DMP_2 is included in one extension wiring, but the first dummy wiring pattern DMP_1 and the third dummy wiring pattern DMP_3 may be included in a plurality of separated wiring patterns. At the portion where the wirings disposed on the second data conductive layer 160 are separated from each other and spaced apart from each other, the upper surface of the fifth insulating layer 125 disposed thereon may be stepped, and the pixel electrode 170 disposed on the portion where the wirings disposed on the second data conductive layer 160 are spaced apart from each other may also be stepped. In this case, the reflectance of light incident from the outside may be different depending on the region of the pixel electrodes 170 disposed over the entire surface of the active area AAR, and the patterns may be visually recognized from the outside due to the reflectance difference.

In particular, when each of the connection wirings CNW is disposed to have the shortest path in the space PXT_C between the pixel columns or the space PXT_R between the pixel rows, the first dummy wiring pattern DMP_1 may include only the second sub-pattern DMP #2 having a short length. In this case, among the wirings extending in the second direction DR2, the second sub-pattern DMP #2 and the second extension portion CNW_2 of the connection wiring CNW disposed in the active fanout area AAR_F are different from the second dummy wiring pattern DMP_2 disposed in the main active area AAR_M in arrangement, length, and the like, so that a difference in reflectance between the active areas AAR is further increased, the probability that some wirings are visually recognized as a pattern from the outside may increase. As the second sub-patterns DMP #2 having a short length are arranged in the active fanout area AAR_F, and the second dummy wiring patterns DMP_2 having a long length are arranged in the main active area AAR_M, a difference in reflectance between the active fanout area AAR_F and the main active area AAR_M increases, so that the active fanout area AAR_F and the main active area AAR_M may be divided into different areas.

In the display device 1 according to an embodiment, each connection wiring CNW does not have the shortest path in the space PXT_C between the pixel columns or the space PXT_R between the pixel rows, and is formed as a path in which two or more pixel rows PXR or pixel columns PXC are arranged therebetween. For example, as shown in FIG. 12, the connection wirings CNW are arranged in a path having a shape extending in the first direction DR1 as compared to the second direction DR2. The lengths of the portions extending in the first direction DR1 in the connection wirings CNW may be longer than the lengths of the portions extending in the second direction DR2 in the connection wirings CNW, and a space in which dummy wiring patterns DMPs may be disposed may be secured between the plurality of connection wirings CNW. In the active fanout area AAR_F, the first dummy wiring patterns DMP_1 similar to the dummy wiring patterns DMP_2 and DMP_3 disposed in the main active area AAR_M are disposed between the connection wirings CNW, and thus the appearance defect due to the arrangement of the dummy wiring patterns DMP may be alleviated. In the active area AAR of the display device 1, the dummy wiring patterns DMPs are arranged in an area where the connection wirings CNW are arranged (or the active fanout area AAR_F) and an area where the connection wirings CNW are not arranged (or the main active area AAR_M), respectively, to prevent the dummy wiring patterns DMPs from being divided into different areas from each other and being visually recognized. The display device 1 includes the dummy wiring patterns DMP arranged similarly to the connection wirings CNW, and in addition, sets the paths of the connection wirings CNW such that the dummy wiring patterns DMP may be arranged over the entire active area AAR, thereby preventing the appearance defects caused by the connection wiring CNW passing through the active area AAR.

Hereinafter, various embodiments of the display device 1 will be described with reference to other drawings.

Figure 14:
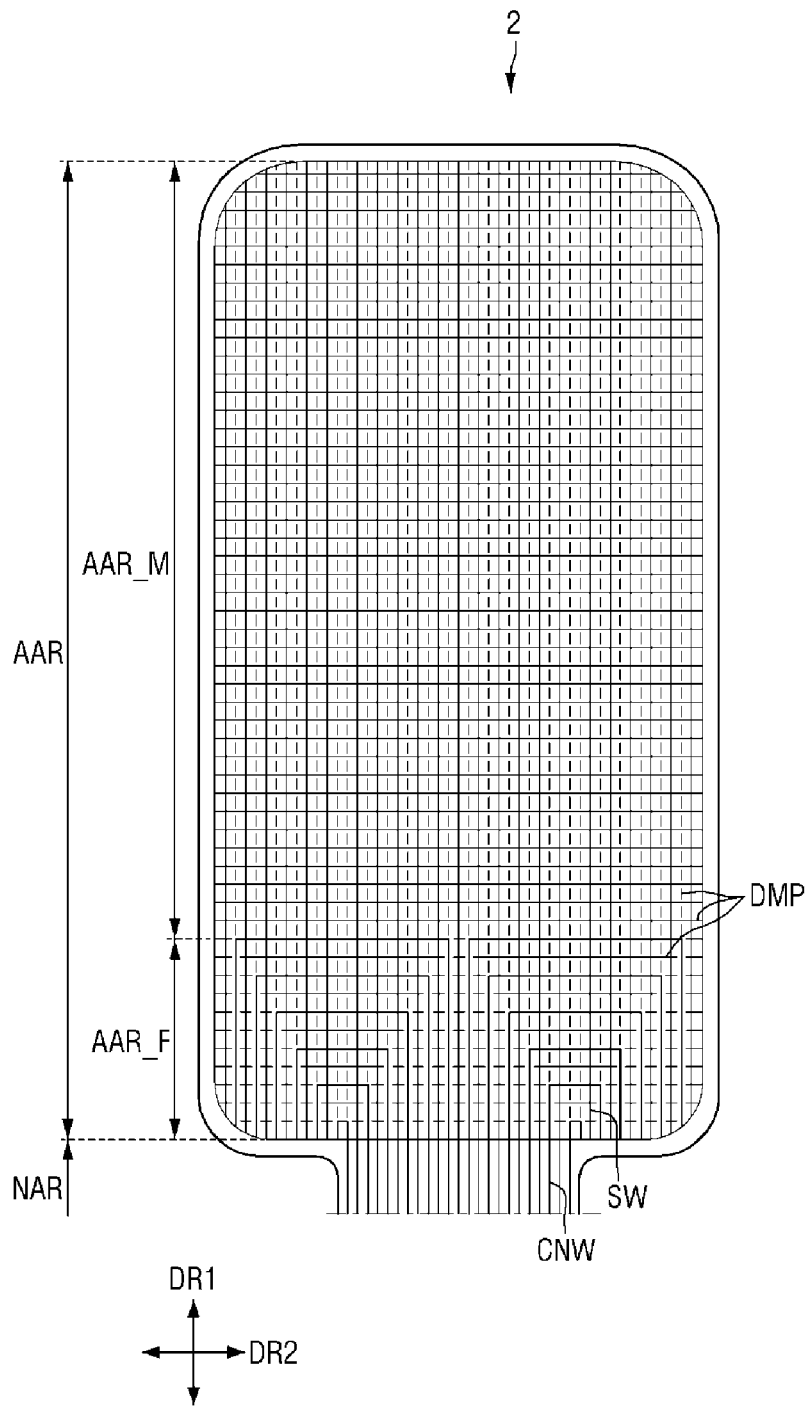
FIG. 14 is a schematic layout view illustrating a wiring arrangement of a display device according to another embodiment.
Figure 15:
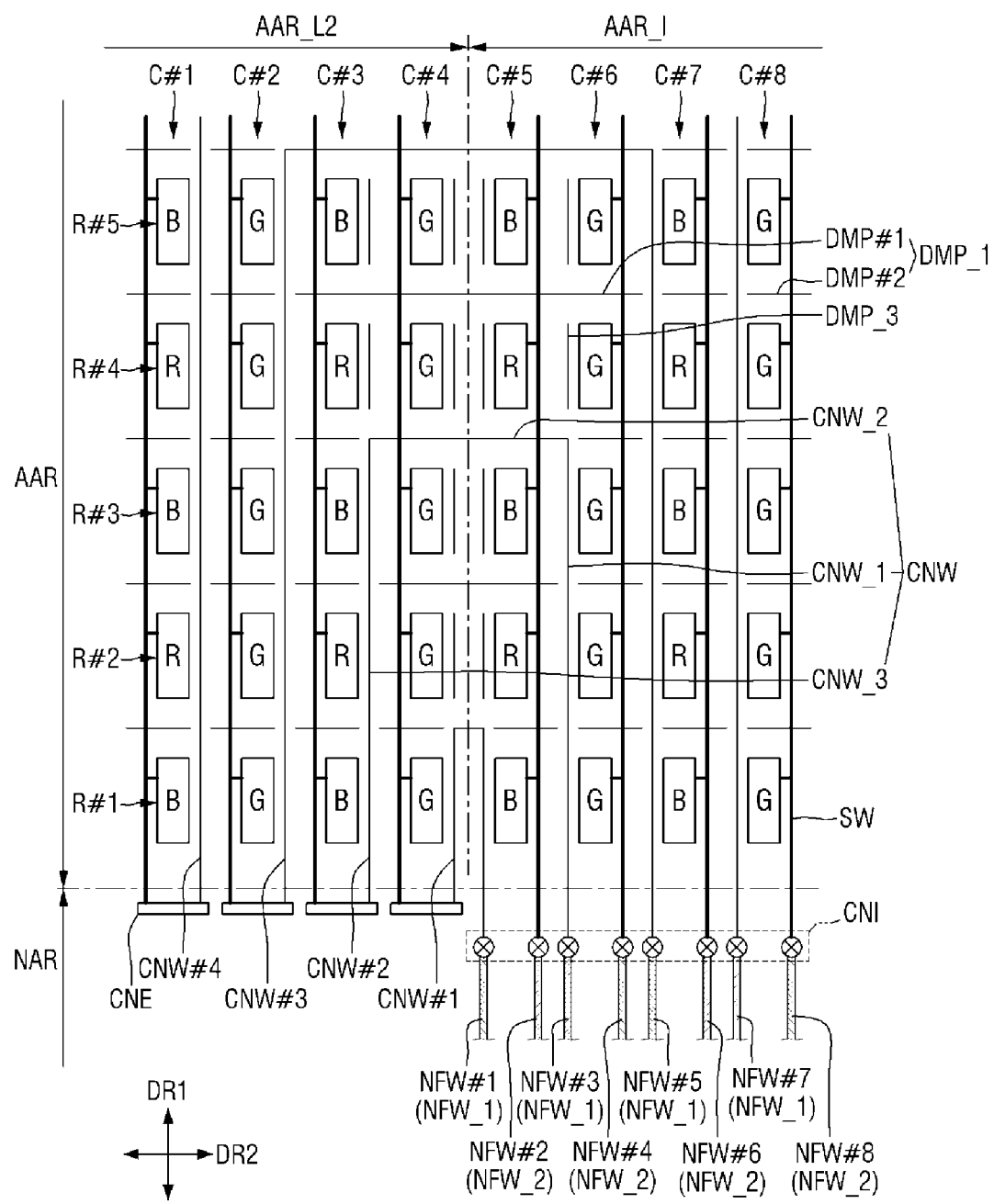
FIG. 15 is a partial layout view illustrating the arrangement of data lines arranged in an active fanout area of the display device of FIG. 14.

FIG. 14 is a schematic layout view illustrating a wiring arrangement of a display device according to another embodiment, and FIG. 15 is a partial layout view illustrating the arrangement of data lines arranged in an active fanout area of the display device of FIG. 14.

Referring to FIGS. 14 and 15, in a display device 2, third dummy wiring patterns DMP_3 may be disposed even in the active fanout area AAR_F. In the active fanout area AAR_F, third dummy wiring patterns DMP_3 extending in the first direction DR1 may be further disposed in addition to the first dummy wiring patterns DMP_1. The present embodiment is characterized in that the third dummy wiring patterns DMP_3 are disposed over the entire active area AAR, thereby preventing the appearance defects caused by wirings extending in the first direction DR1.

The third dummy wiring patterns DMP_3 disposed in the active fanout area AAR_F may be arranged in a pixel row PXR where the first extension portion CNW_1 and third extension portion CNW_3 of the connection wiring CNW are not disposed, in the space between the pixel columns. In an exemplary embodiment, at least some of the third dummy wiring patterns DMP_3 may be arranged between the second extension portion CNW_2 of the connection wiring CNW and the first sub-pattern DMP #1 of the first dummy wiring pattern DMP_1. Further, at least some of the third dummy wiring patterns DMP_3 may be arranged to be placed on an extension line where the first extension portion CNW_1 and third extension portion CNW_3 of the connection wire CNW extend.

For example, some of the third dummy wiring patterns DMP_3 may be respectively in the second to fifth pixel rows PXR #2, PXR #3, PXR #4, and PXR #5 in the space PXT_C #45 between the fourth pixel columns. The third dummy wiring patterns DMP_3 may be spaced apart from each other between the second extension portion CNW_2 of the connection wiring CNW extending in the second direction DR2 and the first sub-pattern DMP #1 of the first dummy wiring pattern DMP_1 so as not to intersect the second extension portion CNW_2 of the connection wiring CNW and the first sub-pattern DMP #1 of the first dummy wiring pattern DMP_1 therebetween. The third dummy wiring patterns DMP_3 arranged in the space PXT_C #45 between the fourth pixel columns may be arranged to lie on the same line extending from the first extension portion CNW_1 and third extension portion CNW_3 of the first connection line CNW #1 in the first direction DR1.

Similarly, some of the third dummy wiring patterns DMP_3 may be arranged in the fourth and fifth pixel rows PXR #4 and PXR #in the space PXT_C #34 between the third pixel columns and the space PXT_C #56 between the fifth pixel column, respectively. The third dummy wiring patterns DMP arranged in the space PXT_C #34 between the third pixel columns and the space PXT_C #56 between the fifth pixel column may be arranged to lie on the same line extending from the first extension portion CNW_1 and third extension portion CNW_3 of the first connection line CNW #1 in the first direction DR1.

In the connection wirings CNW disposed in the active fanout area AAR_F and the dummy wiring patterns DMP disposed in the main active area AAR_M, the wirings extending in the first direction DR1 have different shapes from each other. The first extension portion CNW_1 and third extension portion CNW_3 of the connection wiring CNW may be disposed over the plurality of pixel rows PXR, whereas the third dummy wiring pattern DMP_3 disposed in the main active area AAR_M may be disposed in only one pixel row PXR. The reason for this may be understood from the fact that only wirings disconnected in the first direction DR1 among the wirings extending in the first direction DR1 are disposed in the main active area AAR_M and that only wirings connected as one without being disconnected among the wirings extending in the first direction DR1 are disposed in the active fanout area AAR_F. Similar to the wirings extending in the second direction DR2, the main active area AAR_M and the active fanout area AAR_F may be recognized as areas separated from each other by the arrangement of the wirings extending in the first direction DR1. The connection wirings CNW may be arranged to secure a space between the second extensions CNW_2 such that the first sub-pattern DMP #1 disposed in the second direction DR2 is disposed in the active fanout area AAR_F.

According to an embodiment, the display device 2 may further be provided with the third dummy wiring patterns DMP_3 arranged in the space secured by the connection wirings CNW in the same pattern as the main active area AAR_M, thereby arranging the wirings having almost similar patterns in the main active area AAR_M and the active fanout area AAR_F. Accordingly, a difference in reflectance of external light for each region is reduced, and it is possible to further prevent appearance defects visually recognized as areas separated from each other. Since other descriptions are the same as those described above, detailed descriptions thereof will be omitted.

Figure 16:
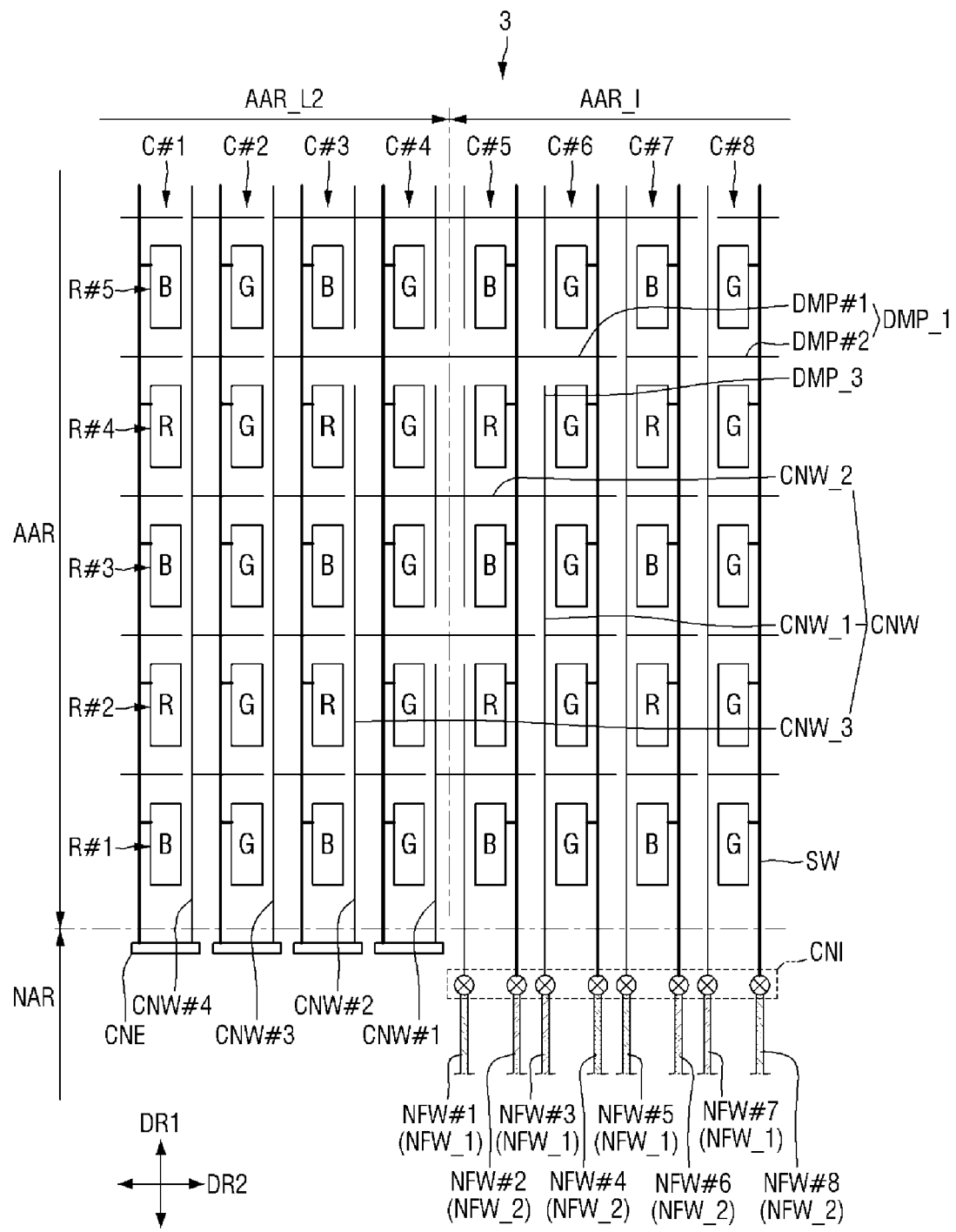
FIG. 16 is a partial layout view illustrating the arrangement of data lines arranged in an active fanout area of s display device according to another embodiment.

FIG. 16 is a partial layout view illustrating the arrangement of data lines arranged in an active fanout area of s display device according to another embodiment.

Referring to FIG. 16, in a display device 3 according to another embodiment, a plurality of dummy wiring patterns DMPs may be connected to other wirings, for example, connection wirings CNW. Although dummy wiring patterns DMP may be arranged in the active area AAR in a floating state, the dummy wiring patterns DMP may be connected to the connection wirings CNW as in the present embodiment to transmit the same electrical signal. The first dummy wiring patterns DMP_1 and third dummy wiring patterns DMP_3 arranged in the active fanout area AAR_F may be directly connected to any one of adjacent connection wirings CNW. The present embodiment is characterized in that the dummy wiring patterns DMP arranged in the active fanout area AAR_F are not arranged in a floating state.

The first sub-patterns DMP #1 of the first dummy wiring pattern DMP_1 may further extend to one side of the second direction DR2 to be directly connected to the third extension portion CNW_3 of the connection wiring CNW. The second sub-patterns DMP #2 of the first dummy wiring pattern DMP_1 may further extend to one side of the second direction DR2 to be directly connected to the first extension portion CNW_1 or third extension portion CNW_3 of the connection wiring CNW. The third dummy wiring patterns DMP_3 may further extend in one side of the first direction DR1 to be directly connected to the second extension portion CNW_2 of the adjacent connection wiring CNW.

However, the first dummy wiring patterns DMP_1 and the third dummy wiring patterns DMP_3 are connected to one connection wiring CNW, and are not connected to the other connection wiring CNW at the same time. When the dummy wiring patterns DMP are connected to the plurality of connecting wires CNW, an undesired signal may be transmitted to a plurality of data lines transmitting a data signal to each pixel PX. In order to prevent this problem, the dummy wiring patterns DMPs may be directly connected to only one connection wiring CNW.

The dummy wiring patterns DMP may be connected to the connection wirings CNW in a predetermined arrangement, but the present invention is not limited thereto. In an embodiment, the dummy wiring patterns DMP may extend in a random rule to be connected to the connecting wirings CNW. For example, some first sub-patterns DMP #1 may extend to one side in the second direction DR2 to connected to the first extension portion CNW_1 of the connection wiring CNW, and the other first sub-patterns DMP #1 may extend to the other side of the second direction DR2 to be connected to the third extension portion CNW_3 of the connection wiring CNW. As the dummy wiring patterns DMP extend without direction, the dummy wiring patterns DMP in the active fanout area AAR_F may be prevented from being recognized as a specific pattern.

Figure 17:
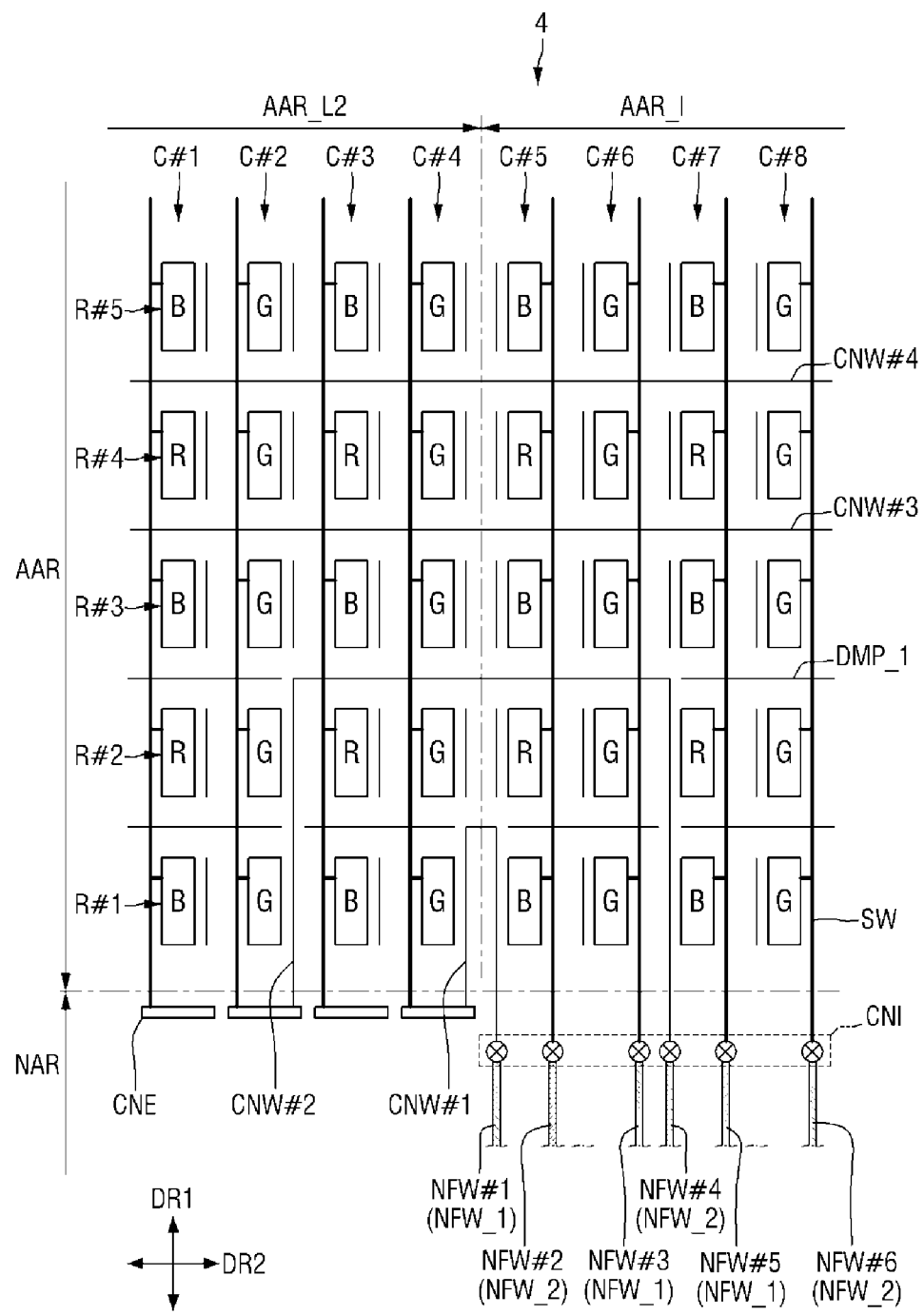
FIG. 17 is a partial layout view illustrating the arrangement of data lines arranged in an active fanout area of s display device according to another embodiment.

FIG. 17 is a partial layout view illustrating the arrangement of data lines arranged in an active fanout area of s display device according to another embodiment.

Referring to FIG. 17, in a display device 4 according to another embodiment, a plurality of connection wirings CNW may be arranged in a path having a shape extended in the second direction DR2 rather than in the first direction DR1. That is, the second extension portions CNW_2 of the connection wirings CNW may be arranged in the space PXT_R between the pixel rows arranged in the active fanout area AAR_F, and the first extension portion CNW_1 and third extension portion CNW_3 of the connection wiring CNW may not be disposed in a portion of the space PXT_C between the pixel columns. The present embodiment is characterized in that paths where the connection wirings CNW are arranged are different.

For example, the second extension portion CNW_2 of the first connection wiring CNW #1 may be disposed in the space PXT_R #12 between the first pixel rows, and the second extension portion CNW_2 of the second connection wiring CNW #2 may be disposed in the space PXT_R #23 between the second pixel rows. Similarly, the second extension portion CNW_2 of the third connection wiring CNW #3 and the second extension portion CNW_2 of the fourth connection wiring CNW #4 may be disposed in the space PXT_R #34 between the third pixel rows and the space PXT_R #45 between the fourth pixel rows, respectively. Unlike the embodiment of FIG. 12, The distance between the second extension portions CNW_2 of the plurality of connection wirings CNW may be substantially the same as the width of each pixel row PXR in the first direction DR1. Each of the plurality of second extension portions CNW_2 may be disposed in the space PXT_R between the pixel rows.

The first extension portion CNW_1 and third extension portion CNW_3 of the first connection wiring CNW #1 are disposed in the space PXT_C #45 between the fourth pixel columns. The first extension portion CNW_1 and third extension portion CNW_3 of the second connection wiring CNW #2 are disposed in the space PXT_C #23 between the second pixel columns and the space PXT_C #67 between the sixth pixel columns, respectively. The first extension portion CNW_1 and third extension portion CNW_3 of the connection wiring CNW may not be disposed in the space PXT_C #34 between the third pixel columns and the space PXT_C #56 between the fifth pixel columns. At least two pixel columns PXC may be disposed between the first extension portion CNW_1 and third extension portion CNW_3 of the neighboring connection wiring CNW.

The first dummy wiring patterns DMP_1 may be disposed in the space PXT_R between the pixel rows together with the second extension portion CNW_2 of the connection wiring CNW. As the second extension portions CNW_2 of the connection wiring CNW are disposed in the space PXT_R between the pixel rows, the first dummy wiring patterns DMP_1 may be disposed to lie on a virtual extension line where the second extension portion CNW_2 reaches if the second extension portions CNW_2 extends further in the second direction DR2, without being disposed between the second extension portions CNW_2. That is, the first dummy wiring patterns DMP_1 may have the same arrangement as the second sub-pattern ("DMP #2" in FIG. 12).

The third dummy wiring patterns DMP_3 may be disposed in the space PXT_C between the pixel columns. Some of the third dummy wiring patterns DMP_3 may be disposed between the first extension portion CNW_1 and third extension portion CNW_3 of the connection wiring CNW in the space PXT_C between the pixel columns in which the first extension portion CNW_1 and third extension portion CNW_3 of the connection wiring CNW are not disposed. For example, the third dummy wiring patterns DMP_3 may be disposed in the space PXT_C #34 between the third pixel columns and the space PXT_C #56 between the fifth pixel columns, the spaces being located between the first extension portion CNW_1 and third extension CNW_3 of the first connection wiring CNW #1 and the second connection wiring CNW #2. This third dummy wiring pattern DMP_3 may be disposed between the first extension portions CNW_1 and the third extension portions CNW_3 of neighboring connection wirings CNW.

Further, the third dummy wiring patterns DMP_3 may also be disposed in the space PXT_C between the pixel columns in which the first extension portions CNW_1 and the third extension portions CNW_3 of the connection wiring CNW are disposed. These third dummy wiring patterns DMP_3 may be disposed to lie on the extension line where the first extension portion CNW_1 and third extension portions CNW_3 of the connection wiring CNW extend in the first direction DR1.

The display device 4 according to the present embodiment is characterized in that the connection wiring CNW is disposed in a path having a shape extending in the second direction DR2 rather than in the first direction DR1. However, similarly to the embodiment of FIG. 12, a space in which dummy wiring patterns DMP are to be disposed may be secured between the connection wiring CNW, and the first dummy wiring pattern DMP_1 and the third dummy wiring pattern DMP_3 are disposed in the space. Accordingly, appearance defects caused by the dummy wiring patterns DMP disposed in the active fanout area AAR_F and the main active area AAR_M may be prevented.

Figure 18:
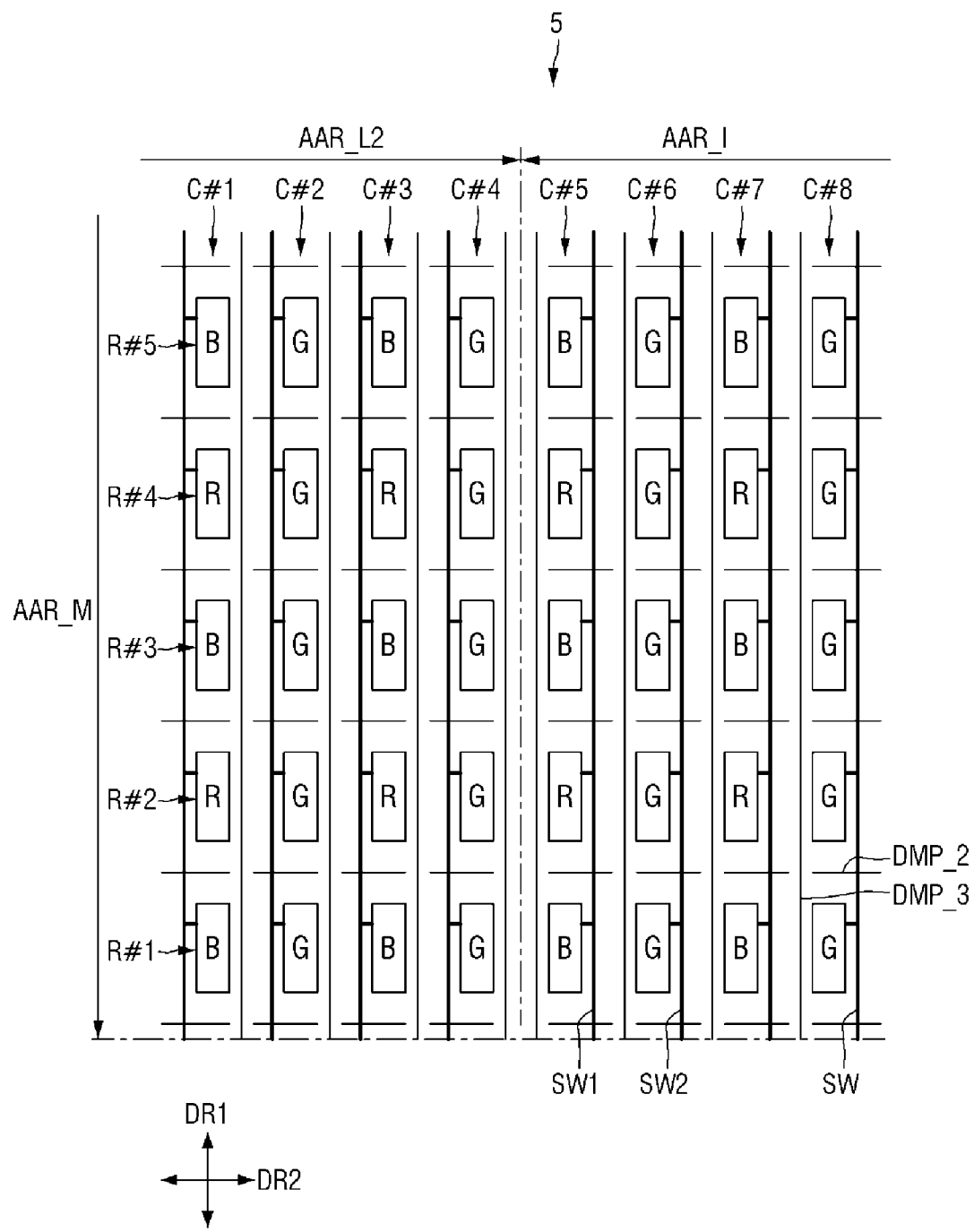
FIG. 18 is a schematic layout view illustrating the arrangement of dummy wiring patterns arranged in a main active area of a display device according to another embodiment.

FIG. 18 is a schematic layout view illustrating the arrangement of dummy wiring patterns arranged in a main active area of a display device according to another embodiment.

Referring to FIG. 18, in a display device 5 according to an embodiment, the third dummy wiring pattern DMP_3 of the main active area AAR_M may extend in the first direction DR1 to be disposed over the plurality of pixel rows PXR, and the second dummy wiring pattern DMP_2 may extend in the second direction DR2 but may be disposed for each pixel column PXC. The second dummy wiring pattern DMP_2 may be separated from another neighboring second dummy wiring pattern DMP_2 in a space PXT_C between pixel columns. The present embodiment is characterized in that the shapes of the dummy wiring patterns DMP of the main active area AAR_M are different from each other.

The dummy wiring pattern DMP is disposed to prevent the connection wiring CNW from being visually recognized as a specific pattern in the active area AAR. The dummy wiring patterns DMP arranged in the main active area AAR_M may be arranged in a similar shape to the connection wiring CNW disposed in the active fanout area AAR_F to more effectively prevent appearance defects.

As described above, the connecting wirings CNW may be arranged in a path having a shape extending in the first direction DR1 rather than in the second direction DR2. In this case, in the connection wiring CNW, the length of each of the first extension portion CNW_1 and the third extension portion CNW_3 measure in the first direction DR1 may be longer than the length of the second extension portion CNW_2 measured in the second direction DR2. The connection wirings CNW disposed in the active fanout area AAR_F may be visually recognized in a shape extending in the first direction DR1. In response to this, the dummy wiring patterns DMP disposed in the main active area AAR_M may include third dummy wiring patterns DMP_3 extending in the first direction DR1, and second dummy wiring patterns DMP_2 extending in the second direction DR2 and separated from each other. In particular, since the signal wirings SW arranged in the first data conductive layer 150 also extend in the first direction DR1, the dummy wiring patterns DMP may be arranged in a similar shape. In the display device 5, the dummy wiring patterns DMPs are arranged in a more similar shape to the connection wiring CNW, and an area between the main active area AAR_M and the active fanout area AAR_F is distinguished to further prevent visually-recognized appearance defects.

Figure 19:
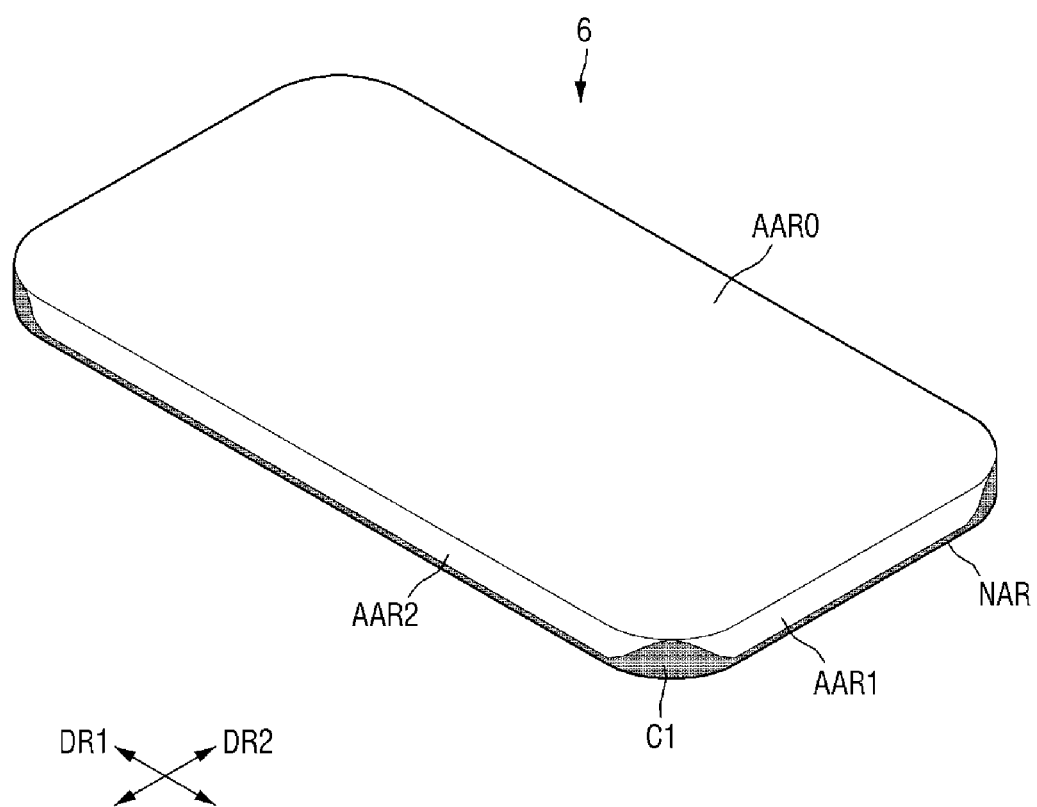
FIG. 19 is a perspective view of a display device according to another embodiment.
Figure 20:
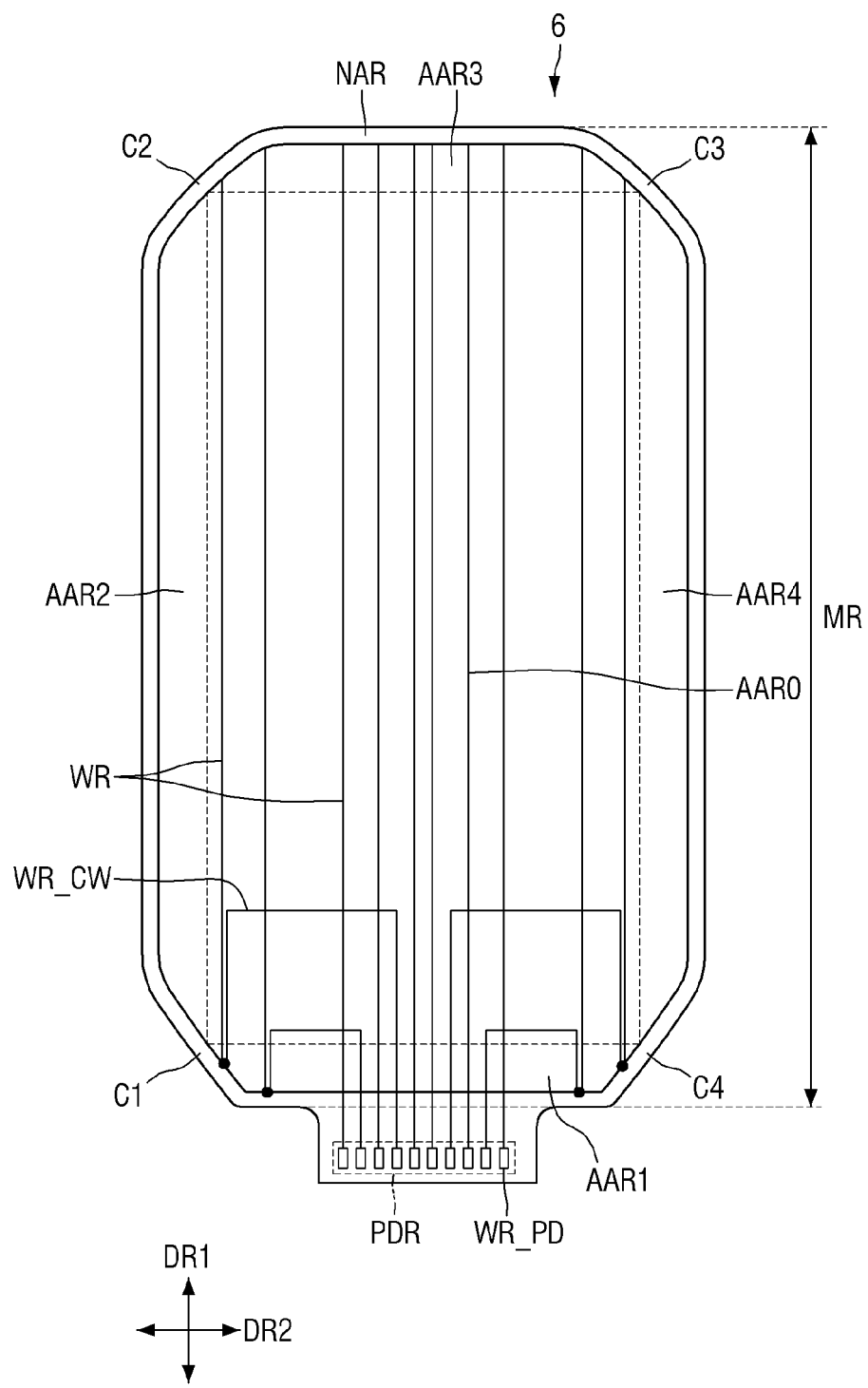
FIG. 20 is a development view of the display device of FIG. 19.

FIG. 19 is a perspective view of a display device according to another embodiment, and FIG. 20 is a development view of the display device of FIG. 19. FIGS. 19 and 20 illustrate that a display device 6 may be applied as a multi-face display device.

Referring to FIGS. 19 and 20, a display device 6 according to the present embodiment includes a front active area AAR0, side active areas AAR1, AAR2, AAR3, AAR4, and corner areas C1, C2, C3, and C4.

The front active area AAR0 and the side active areas AAR1, AAR2, AAR3, and AAR4 may be included in an active area AAR displaying an image. The side active areas AAR1, AAR2, AAR3, and AAR4 may be bent at an angle of 30° to 120° with respect to the front active area AAR0.

The corner areas C1, C2, C3, and C4 may be located among the side active areas AAR1, AAR2, AAR3, and AAR4. The corner areas C1, C2, C3, and C4 may include first to fourth corner areas C1, C2, C3, and C4 located among first to fourth side active areas AAR1, AAR2, AAR3, and AAR4, respectively, as shown in FIG. 20. The first to fourth corner areas C1, C2, C3, and C4 may be disposed adjacent to four corners where long sides and short sides of the front active area AAR0 meet each other, respectively. The first to fourth corner areas C1, C2, C3, and C4 may have substantially the same function or configuration except for their positions. The corner areas C1, C2, C3, and C4 are non-active areas NAR that do not display an image, and may provide a space through which wirings pass.

In the present embodiment, similarly to that described with reference to FIG. 6, the width of the pad unit PDR is smaller than the width of the entire active area AAR in the second direction DR2. Accordingly, signals may be transmitted to the first side active area AAR1, the front active area AAR0, and the third side active area AAR3, which overlap the arrangement area of wirings extending from the pad unit PDR in the first direction DR1, through direct-type wirings, but the second side active area AAR2 or the fourth side active area AA4 is difficult to secure a space of a non-active area NAR capable of transmitting signals through the direct-type wings. For the second side active area AAR2 or the fourth side active area AA4, signals may be transmitted through via-type wirings using bypass wirings WD_CN passing through the active area AAR as described above. Since a detailed method for this has been described in detail above, a duplicate description will be omitted.

The display device according to an embodiment includes connection wirings passing through an active area, and dummy wiring patterns arranged in an area in which the connection wirings are not disposed. The connecting wirings may be arranged to have a shape extending in the vertical direction compared to the horizontal direction in the active area, and a plurality of pixels may be disposed between horizontal extension portions of adjacent connection wirings. The connection wirings may secure a space in which other dummy wiring patterns may be disposed therebetween, so that a plurality of dummy wiring patterns may be disposed between the connection wirings.

Accordingly, in the active area of the display device, dummy wiring patterns are respectively disposed in an area where connection wirings are disposed and an area where connection wirings are not disposed, thereby preventing the dummy wiring patterns from being divided into different areas from each other and visually recognized. The display device includes the dummy wiring patterns arranged similarly to the connection wirings, and in addition, sets the paths of the connection wirings such that the dummy wiring patterns may be arranged over the entire active area, thereby preventing the appearance defects caused by the connection wiring passing through the active area.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device, comprising:
   an active area including a plurality of pixels arranged in a matrix shape and which receive a data signal by a data line;
   a non-active area disposed at one side of the active area in a first direction and including a pad unit;
   a plurality of non-active fanout wirings disposed in the non-active area and connected to the pad unit;
   a plurality of signal wirings extending in the first direction to traverse the active area and connected to the plurality of pixels; and
   a plurality of connection wirings, each at least partially passing through the active area and connecting some of the plurality of non-active fanout wirings and some of the plurality of signal wirings,
   wherein each of the plurality of connection wirings includes a first extension portion extending in the first direction, a second extension portion extending in a second direction crossing the first direction, and a third extension portion extending in the first direction, and
   at least two of the pixels are disposed between corresponding extension portions of two connection wirings adjacent to each other among the plurality of connection wirings, and the at least two pixels are arranged along a direction in which the corresponding extension portions are spaced apart from each other.

2. The display device of claim 1,
   wherein the plurality of pixels includes a plurality of pixel columns each including pixels arranged in the first direction and a plurality of pixel rows each including pixels arranged in the second direction, and the second extension portion of the connection wiring is disposed between two adjacent pixel rows of the plurality of pixel rows.

3. The display device of claim 2, wherein at least two of the pixel rows are disposed between the second extension portions of the two connection wirings adjacent to each other.

4. The display device of claim 2, further comprising:
a first dummy wiring pattern disposed between the connection wirings,
wherein the first dummy wiring pattern includes a first sub-pattern disposed between the second extension portions of the two connection wirings adjacent to each other, and the first sub-pattern extends in the second direction.

5. The display device of claim 4, wherein the first sub-pattern is disposed in a space between two adjacent pixel rows of the plurality of pixel rows, and the second extension portion of the connection wirings is not disposed in the space.

6. The display device of claim 4, wherein the first dummy wiring pattern includes a plurality of second sub-patterns separated from the second extension portions of the two connection wirings and disposed on a virtual extension line where the second extension portion reaches if the second extension portion extends further.

7. The display device of claim 4, wherein at least some of the first dummy wiring patterns are directly connected to the connection wiring.

8. The display device of claim 4, wherein the active area includes an active fanout area in which the connection wirings are disposed adjacent to the non-active area, and a main active area which is an area other than the active fanout area in the active area and in which the connection wirings are not disposed, and
further includes a second dummy wiring pattern disposed in the main active area and extending in the second direction and a third dummy wiring pattern disposed in the main active area and extending in the first direction.

9. The display device of claim 8, wherein the second dummy wiring pattern intersects the signal wiring and is disposed over the plurality of pixel columns.

10. The display device of claim 8, wherein the third dummy wiring pattern is disposed in a space between the pixel columns at the pixel row of the main active area.

11. The display device of claim 2, wherein each of the signal wirings is disposed between the pixel columns, and
each of the first extension portion and the third extension portion of the connection wiring is disposed in a space between different pixel columns from each other.

12. The display device of claim 11, wherein at least two of the pixel columns are disposed between the first extension portions of the two adjacent connection wirings.

13. The display device of claim 2, wherein the first extension portion and the third extension portion of at least one of the connection wirings is disposed in a space between two adjacent pixel columns.

14. The display device of claim 1, wherein the plurality of signal wirings is included in a first data conductive layer, and
the plurality of connection wirings is included in a second data conductive layer different from the first data conductive layer.

15. The display device of claim 14, wherein the non-active fanout wiring includes a first non-active fanout wiring connected to the connection wiring and a second non-active fanout wiring directly connected to the signal wiring, and
the first non-active fanout wiring and the second non-active fanout wiring are included in different conductive layers from each other.

16. A display device, comprising:
an active area in which a plurality of pixels is arranged;
a non-active area disposed at one side of the active area in a first direction;
a plurality of non-active fanout wirings disposed in the non-active area and including a first non-active fanout wiring and a second non-active fanout wiring alternately arranged along a second direction crossing the first direction;
a plurality of signal wirings extended in the first direction, disposed in an inner active area overlapping with the non-active fanout wiring when the non-active fanout wiring extends in the first direction in the active area and disposed in an outer active area not overlapping the non-active fanout wiring in the active area;
a plurality of connection wirings connecting the non-active fanout wiring and the signal wiring disposed in the outer active area via the active area; and
a plurality of dummy wiring patterns disposed in the active area and not intersecting the connection wiring,
wherein the connection wiring is disposed along a space between the plurality of pixels, and a length of an extension portion of the connection wiring in the first direction is longer than a length of an extension portion of the connection wiring in the second direction.

17. The display device of claim 16, wherein the plurality of connection wirings and the plurality of the dummy wiring patterns are included in a same conductive layer.

18. The display device of claim 16, wherein the plurality of connection wirings includes a first extension portion extending in the first direction, a second extension portion extending in the second direction crossing the first direction, and a third extension portion extending in the first direction, and
at least two of the pixels are disposed between the second extension portions of two connection wirings adjacent to each other among the plurality of connection wirings.

19. The display device of claim 18, wherein the dummy wiring pattern includes a first dummy wiring pattern disposed between the connection wirings and extending in the second direction, a second dummy wiring pattern extending in the second direction in an area where the connection wirings are not disposed in the active area, and a third dummy wiring pattern extending in the first direction and not intersecting the first dummy wiring pattern and the second dummy wiring pattern.

20. The display device of claim 19, wherein the first dummy wiring pattern includes a first sub-pattern disposed between the second extension portions of the two connection wirings adjacent to each other, the first sub-pattern extending in the second direction, and a plurality of second sub-patterns separated from the second extension portions of the two connection wirings and disposed on a virtual extension line where the second extension portion reaches if the second extension portion extends further, and at least some of the third dummy wiring patterns are disposed between the second extension portion of the connection wiring and the first sub-pattern.

* * * * *